(12) United States Patent
Lu et al.

(10) Patent No.: US 11,222,870 B2
(45) Date of Patent: Jan. 11, 2022

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Wen-Long Lu, Kaohsiung (TW); Min Lung Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/796,921

(22) Filed: Feb. 20, 2020

(65) Prior Publication Data
US 2021/0265311 A1   Aug. 26, 2021

(51) Int. Cl.
| | |
|---|---|
| *H01L 21/48* | (2006.01) |
| *H01L 25/065* | (2006.01) |
| *H01L 23/538* | (2006.01) |
| *H01L 25/00* | (2006.01) |
| *H01L 23/31* | (2006.01) |

(52) U.S. Cl.
CPC ........ *H01L 25/0657* (2013.01); *H01L 21/486* (2013.01); *H01L 21/4853* (2013.01); *H01L 23/3128* (2013.01); *H01L 23/5385* (2013.01); *H01L 23/5386* (2013.01); *H01L 25/50* (2013.01); *H01L 2225/0652* (2013.01); *H01L 2225/06548* (2013.01)

(58) Field of Classification Search
CPC ............. H01L 25/0657; H01L 21/4853; H01L 21/486
See application file for complete search history.

(56) References Cited

U.S. PATENT DOCUMENTS

| | | | | |
|---|---|---|---|---|
| 2008/0144180 A1* | 6/2008 | Nishida | ..................... | H01J 11/12 359/601 |
| 2008/0168652 A1* | 7/2008 | Koyama | ................ | H05K 3/462 29/830 |

* cited by examiner

*Primary Examiner* — Errol V Fernandes
(74) *Attorney, Agent, or Firm* — Foley & Lardner LLP

(57) ABSTRACT

A semiconductor device package includes a first substrate and a second substrate arranged above the first substrate. A first connector is disposed on the first substrate, and a first conductor passes through the second substrate and connects to the first connector.

20 Claims, 22 Drawing Sheets

SEMICONDUCTOR DEVICE PACKAGE AND METHOD OF MANUFACTURING THE SAME

BACKGROUND

1. Field of the Disclosure

The instant disclosure relates to, amongst other things, a semiconductor device package and method of manufacturing the same, and a semiconductor device package having multiple double side modules which are stacked with each other.

2. Description of Related Art

A semiconductor device includes a plurality of modules. Each module includes a substrate and multiple electronic components with different functions mounted to the substrate. These modules are stacked with each other and electrically connected to each other. The yield rate of the stacked modules is a significant issue for the semiconductor device.

SUMMARY

According to one example embodiment of the instant disclosure, a semiconductor device package includes a first substrate, a first connector, a second substrate and a first conductor. The first substrate has a first surface and the first connector is disposed on the first surface of the first substrate. The second substrate has a first surface facing the first surface of the first substrate. The first conductor passes through the second substrate and electrically connecting to the first connector.

According to another example embodiment of the instant disclosure, a semiconductor device package includes a first substrate, a first connector, a second substrate and a first conductor. The first connector is disposed on the first substrate. The second substrate is arranged above the first substrate. The first conductor penetrates the second substrate and electrically contacting with the first connector.

According to another example embodiment of the instant disclosure, method of manufacturing a semiconductor device package includes: providing a first substrate, disposing a first connector on a first surface of the first substrate, providing a second substrate over the first substrate, forming a first through hole in the second substrate and forming a first conductor passing through the first through hole and electrically connecting to the first connector.

In order to further understanding of the instant disclosure, the following embodiments are provided along with illustrations to facilitate appreciation of the instant disclosure; however, the appended drawings are merely provided for reference and illustration, and do not limit the scope of the instant disclosure.

DETAILED DESCRIPTION

Figure 1:
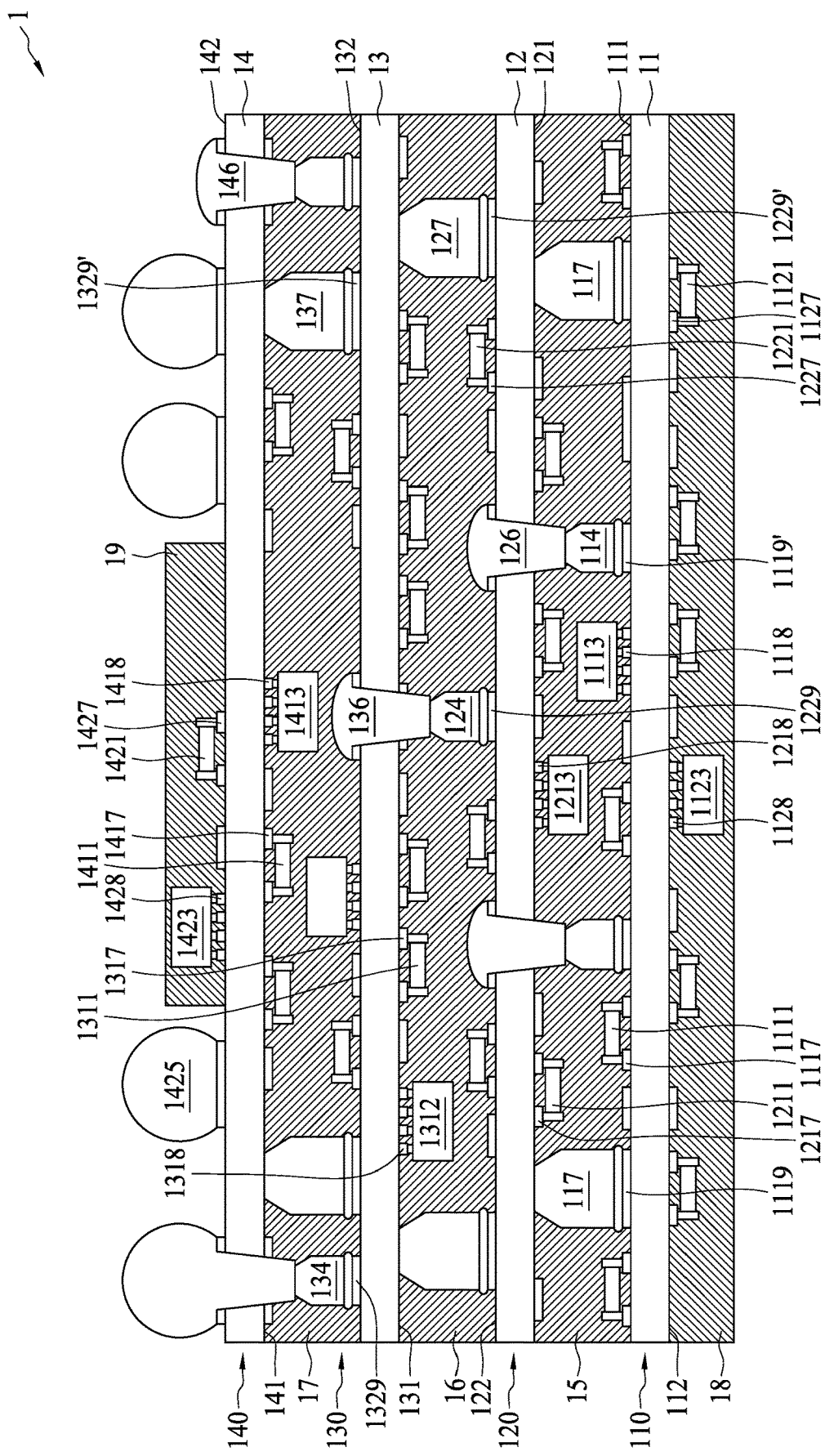
FIG. 1 is a cross-sectional view of a semiconductor device package in accordance with an embodiment of the instant disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Present disclosure provides a semiconductor device package with a multilayer structure includes at least two staking modules. The modules are electrically connected to each other by a conductor and a connector. This configuration prevents the semiconductor device package from being short-circuited in the heating process, and thus the electrical connection between the modules is improved.

FIG. 1 is a cross-sectional view of a semiconductor device package 1 in accordance with some embodiments of the present disclosure. As shown in FIG. 1, the semiconductor device 1 includes four double side modules (DSM) 110, 120, 130 and 140. The double side module 110 includes a substrate 11 with a surface 111 (e.g., an upper surface) and a surface 112 (e.g., a lower surface) opposite to the surface 111. Electronic components 1121 and 1123 are disposed on the surface 112 of the substrate 11. In some embodiments, the electronic components 1121 are mounted to the surface 112 of the substrate 11 by electrical connections 1127, and the electronic component 1123 is mounted to the surface 112 of the substrate 11 by electrical connections 1128. An encapsulant 18 encapsulates the electronic components 1121, 1123 and the surface 112 of the substrate 11. The encapsulant 18 may include molding compounds such epoxy resin, and fillers such as silicon oxide fillers may be filled in the molding compound. In addition, the encapsulant 18 may include a molding underfill (MUF) or a capillary underfill (CUF). Further, electronic components 1111 and 1113 are disposed on the surface 111 of the substrate 11. In some embodiments, the electronic components 1111 are mounted to the surface 111 of the substrate 11 by electrical connections 1117, and the electronic component 1113 is mounted to the surface 111 of the substrate 11 by electrical connections 1118. In addition, connectors 114 and spacers 117 are disposed on the surface 111 of the substrate 11. Generally, a height of the spacer 117 is larger than a height of the connector 114. In some embodiments, the connectors 114 and the spacers 117 are mounted to the surface 111 of the substrate 11 by pads 1119, 1119'. Moreover, in some embodiments, a distance between two spacers 117 is larger than a half of width of the substrate 11. In some embodiments, the spacer 117 is made of metal material. In some embodiments, the spacer 117 is made of non-metal material. Moreover, the connector 114 may have a tapered upper end, and the spacer 117 may have a tapered upper end. The height ratio of the connector 114 to the spacer 117 ranges from 0.4 to 1.0.

The double side module 120 includes a substrate 12 with a surface 121 (e.g., a lower surface) facing the surface 111 of the substrate 11 and a surface 122 opposite to the surface 121. Electronic components 1211 and 1213 are disposed on the surface 121 of the substrate 12. In some embodiments, the electronic components 1211 are mounted to the surface 121 of the substrate 12 by electrical connections 1217, and the electronic component 1213 is mounted to the surface 121 of the substrate 12 by electrical connections 1218. Further, the spacers 117 contact with the surface 121 of the substrate 12. In other words, the spacers 117 support the substrate 12. Thus, the distance between the surface 111 of the substrate 11 and the surface 121 of the substrate 12 is defined by the height of the spacer 117. Therefore, the ratio of the height of the connector 114 to the distance between the surface 111 of the substrate 11 and the surface 121 of the substrate 12 ranges from 0.4 to 1.0. In some embodiments, the spacer 117 is made of metal material, and thus the substrates 11 and 12 are electrically connected to each other by the spacer 117. Further, electronic components 1221 are disposed on the surface 122 of the substrate 12. In some embodiments, the electronic components 1221 are mounted to the surface 122 of the substrate 12 by electrical connections 1227. In addition, connectors 124 and spacers 127 are disposed on the surface 122 of the substrate 12. Generally, a height of the spacer 127 is larger than a height of the connector 124. In some embodiments, the connectors 124 and the spacers 127 are mounted to the surface 122 of the substrate 12 by pads 1229, 1229'. Moreover, a distance between two spacers 127 is larger than a half of width of the substrate 12. In some embodiments, the spacer 127 is made of metal material. In some embodiments, the spacer 127 is made of non-metal material. Moreover, the connector 124 may have a tapered upper end, and the spacer 127 may have a tapered upper end. The height ratio of the connector 124 to the spacer 127 ranges from 0.4 to 1.0. In addition, the double side module 120 includes conductors 126 passing through or penetrating the substrate 12 and electrically connecting to the connectors 114. In some embodiments, the conductor 126 is made of solder materials. In some embodiments, the conductor 126 and the spacer 127 are made of the same metal material. An encapsulant 15 is arranged between the substrates 11 and 12 and encapsulates the electronic components 1111, 1113, the connectors 114, the surface 112 of the substrate 11, the electronic components 1211, 1213, the surface 121 of the substrate 12 and portions of the conductors 126 which protrude from the surface 121 of the substrate 12. In some embodiments, the encapsulant 15 may include a liquid adhesion. In some embodiments, the encapsulant 15 may include an adhesive tape. In some embodiments, the encapsulant 15 may include an adhesive film.

As shown in FIG. 1, the conductor 126 passes through the substrate 12 and connects to the top of the connector 114. Thus, the modules 110 and 120 can be electrically connected to each other by the conductor 126 and the connector 114. The conductor 126 may be tapered from its upper end to its lower end. Referring to FIG. 1, a cross-sectional width of an upper end of the conductor 126 which is adjacent to the surface 122 of the substrate 12 is larger than a cross-sectional width of a lower end of the conductor 126 which is adjacent to the connector 114.

The double side module 130 includes a substrate 13 with a surface 131 (e.g., a lower surface) facing the surface 122 of the substrate 12 and a surface 132 opposite to the surface 131. Electronic components 1311 and 1313 are disposed on the surface 131 of the substrate 13. In some embodiments, the electronic components 1311 are mounted to the surface 131 of the substrate 13 by electrical connections 1317, and the electronic component 1313 is mounted to the surface 131 of the substrate 13 by electrical connections 1318. Further, the spacers 127 contact with the surface 131 of the substrate 13. In other words, the spacers 127 support the substrate 13. Thus, the distance between the surface 122 of the substrate 12 and the surface 131 of the substrate 13 is defined by the height of the spacer 127. Therefore, the ratio of the height of the connector 124 to the distance between the surface 122 of the substrate 12 and the surface 131 of the substrate 13 ranges from 0.4 to 1.0. In some embodiments, the spacer 127 is made of metal material, and thus the substrates 12 and 13 are electrically connected to each other by the spacer 127. Further, electronic components 1321 and 1323 are disposed on the surface 132 of the substrate 13. In some embodiments, the electronic components 1321 are mounted to the surface 132 of the substrate 13 by electrical connections 1327, and the electronic component 1323 is mounted to the surface 132 of the substrate 13 by electrical connections 1328. In addition, connectors 134 and spacers 137 are disposed on the surface 132 of the substrate 13. Generally, a height of the spacer 137 is larger than a height of the connector 134. In some embodiments, the connectors 134 and the spacers 137 are mounted to the surface 132 of the substrate 13 by pads 1329, 1329'. Moreover, a distance between two spacers 137 is larger than a half of width of the substrate 13. In some embodiments, the spacer 137 is made of metal material. In some embodiments, the spacer 137 is made of non-metal material. Moreover, the connector 134 may have a tapered upper end, and the spacer 137 may have a tapered upper end. The height ratio of the connector 134 to the spacer ranges from 0.4 to 1.0. In addition, the double side module 130 includes a conductor 136 passing through or penetrating the substrate 13 and electrically connecting to the connectors 124. In some embodiments, the conductor 136 is made of solder materials. In some embodiments, the conductor 136 and the spacer 137 are made of the same metal material. An encapsulant 16 is arranged between the substrates 12 and 13 and encapsulates the electronic components 1221, 1223, the connectors 124, portions of the conductor 126 which protrude from the surface 122 of the substrate 12, the surface 122 of the substrate 12 the electronic components 1312, 1313, the surface 131 of the substrate 131 and a portion of the conductor 136 which protrudes from the surface 131 of the substrate 13. The encapsulant 16 may include a liquid adhesion. In some embodiments, the encapsulant 16 may include an adhesive tape. In some embodiments, the encapsulant 16 may include an adhesive film.

As shown in FIG. 1, the conductor 136 passes through the substrate 13 and connects to the top of the connector 124. Thus, the modules 120 and 130 can be electrically connected to each other by the conductor 136 and the connector 124. The conductor 136 may be tapered from its upper end to its lower end. Referring to FIG. 1, a cross-sectional width of an upper end of the conductor 136 which is adjacent to the surface 132 of the substrate 13 is larger than a cross-sectional width of a lower end of the conductor 136 which is adjacent to the connector 124.

The double side module 140 includes a substrate 14 with a surface 141 (e.g., a lower surface) facing the surface 132 of the substrate 13 and a surface 142 opposite to the surface 141. Electronic components 1411 and 1413 are disposed on the surface 141 of the substrate 14. In some embodiments, the electronic components 1411 are mounted to the surface 141 of the substrate 14 by electrical connections 1417, and the electronic component 1413 is mounted to the surface 141 of the substrate 14 by electrical connections 1418. Further, the spacers 137 contact with the surface 141 of the substrate 14. In other words, the spacers 137 support the substrate 14. Thus, the distance between the surface 132 of the substrate 13 and the surface 141 of the substrate 14 is defined by the height of the spacer 137. Therefore, the ratio of the height of the connector 134 to the distance between the surface 132 of the substrate 13 and the surface 141 of the substrate 14 ranges from 0.4 to 1.0. In some embodiments, the spacer 137 is made of metal material, and thus the substrates 13 and 14 are electrically connected to each other by the spacer 137. Further, electronic components 1421 and 1423 are disposed on the surface 142 of the substrate 14. In some embodiments, the electronic component 1421 is mounted to the surface 142 of the substrate 14 by electrical connections 1427, and the electronic component 1423 is mounted to the surface 142 of the substrate 14 by electrical connections 1428. An encapsulant 19 disposed on the surface 142 of the substrate and encapsulates the electronic components 1421 and 1423 and a portion of the surface 142 of the substrate 14. The encapsulant 19 may include molding compounds such epoxy resin, and fillers such as silicon oxide fillers may be filled in the molding compound. In addition, the encapsulant 19 may include a molding underfill (MUF) or a capillary underfill (CUF). Further, electrical connections 1425, such as solder balls, are disposed on the surface 142 of the substrate 14. In some embodiments, the electrical connections 1425 are not covered by the encapsulant 19. In addition, the double side module 140 includes conductors 146 passing through or penetrating the substrate 14 and electrically connecting to the connectors 134. In some embodiments, the conductor 146 is made of solder materials. An encapsulant 17 is arranged between the substrates 13 and 14 and encapsulates the electronic components 1321, 12323, the connectors 134, portions of the conductor 136 which protrude from the surface 132 of the substrate 13, the surface 132 of the substrate 13 the electronic components 1412, 1413, the surface 141 of the substrate 141 and portions of the conductors 146 which protrudes from the surface 141 of the substrate 14. The encapsulant 17 may include a liquid adhesion. In some embodiments, the encapsulant 17 may include an adhesive tape. In some embodiments, the encapsulant 17 may include an adhesive film.

As shown in FIG. 1, the conductor 146 passes through the substrate 14 and connects to the top of the connector 134. Thus, the modules 130 and 140 can be electrically connected to each other by the conductor 146 and the connector 134. The conductor 146 may be tapered from its upper end to its lower end. Referring to FIG. 1, a cross-sectional width of an upper end of the conductor 146 which is adjacent to the surface 142 of the substrate 14 is larger than a cross-sectional width of a lower end of the conductor 146 which is adjacent to the connector 134.

Figure 2A:
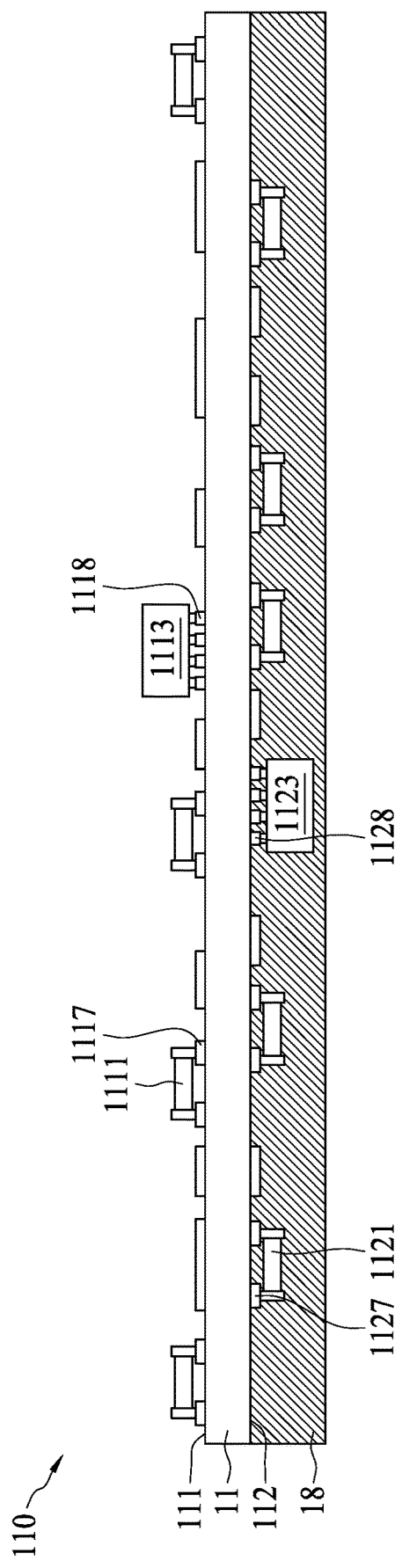
FIG. 2A, FIG. 2B, FIG. 2C, FIG. 2D, FIG. 2E, FIG. 2F, FIG. 2G, FIG. 2H, FIG. 2I, FIG. 2J, FIG. 2K, FIG. 2L, FIG. 2M, FIG. 2N, FIG. 2O, FIG. 2P, FIG. 2Q, FIG. 2R, and FIG. 2S illustrate a method of manufacturing a semiconductor device package in accordance with another embodiment of the instant disclosure.

FIG. 2A, FIG. 2B, FIG. 2C, FIG. 2D, FIG. 2E, FIG. 2F, FIG. 2G, FIG. 2H, FIG. 2I, FIG. 2J. FIG. 2K, FIG. 2L, FIG. 2M, FIG. 2N, FIG. 2O, FIG. 2P, FIG. 2Q, FIG. 2R and FIG. 2S illustrate a method of manufacturing a semiconductor device package 1 in accordance with another embodiment of the instant disclosure. In FIG. 2A, a double side module (DSM) 110 is provided. The double side module 110 includes a substrate 11. The substrate 11 includes a surface 111 and a surface 112 opposite to the surface 111. Electronic components 1121 and 1123 are disposed on the surface 112 of the substrate 11, and an encapsulant 18 is disposed on the surface 112 of the substrate 11 and encapsulates the electronic components 1121, 1123 and the surface 112 of the substrate 11. Further, electronic components 1111 and 1113 are disposed on the surface 111 of the substrate 11. In some embodiments, the electronic components 1111 and 1113 are mounted to the surface 111 of the substrate 11 by electrical connections 1117 and 1118, and the electrical connections 1117 and 1118 are made of a first solder material.

Figure 2B:
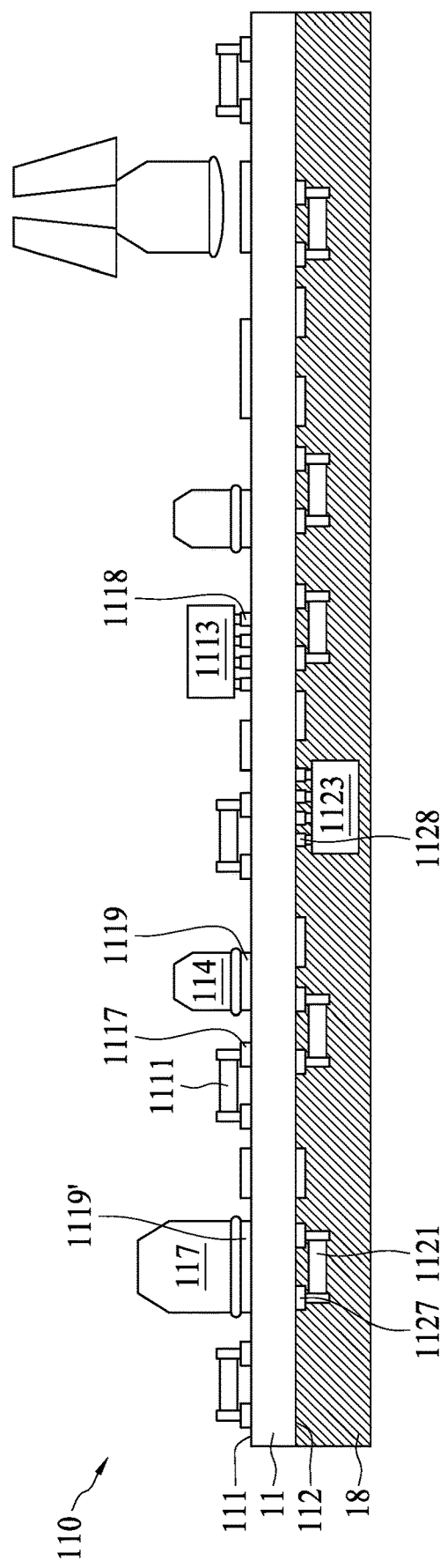

In FIG. 2B, connectors 114 and spacers 117 are arranged on the surface 111 of the substrate 11. In some embodiments, the connectors 114 and the spacers 117 are arranged on the pads 1119, 119', and a second solder material is arranged between the connector 114 and the pad 1119 and between the spacer 117 and the pad 1119'.

Figure 2C:
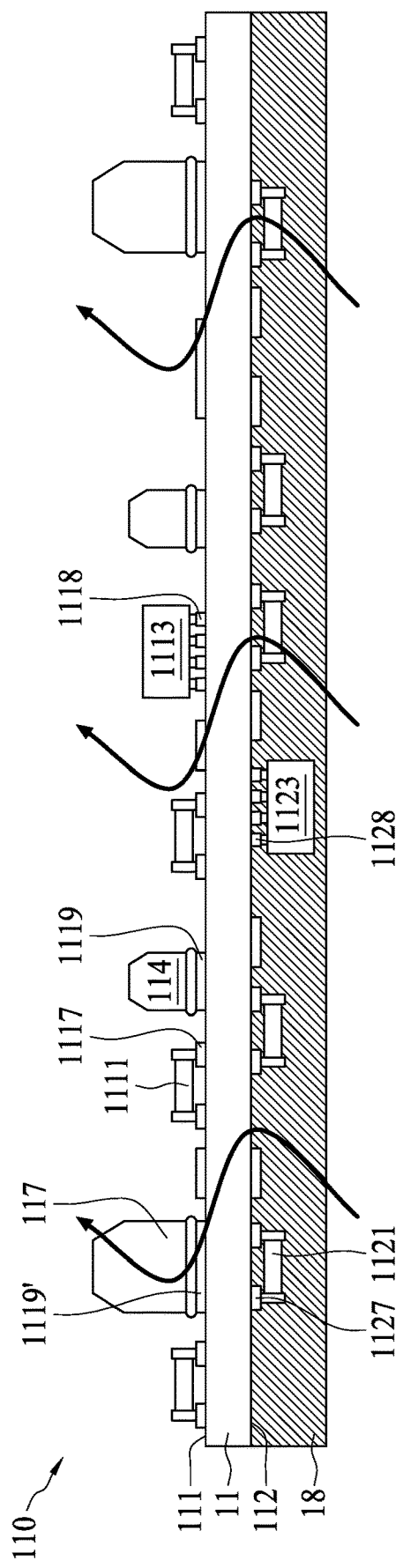

In FIG. 2C, a reflow process may be carried out such that the connectors 114 and the spacers 117 are mounted to the substrate 11. A melting point of the first solder material is greater than a melting point the second solder material. Thus, the melting point of the first solder material is greater than the reflow temperature. That is, the electronic components 1111 and 1113 disposed on the surface 111 of the substrate 11 would not be affected by the high temperature during the reflow process.

Figure 2D:
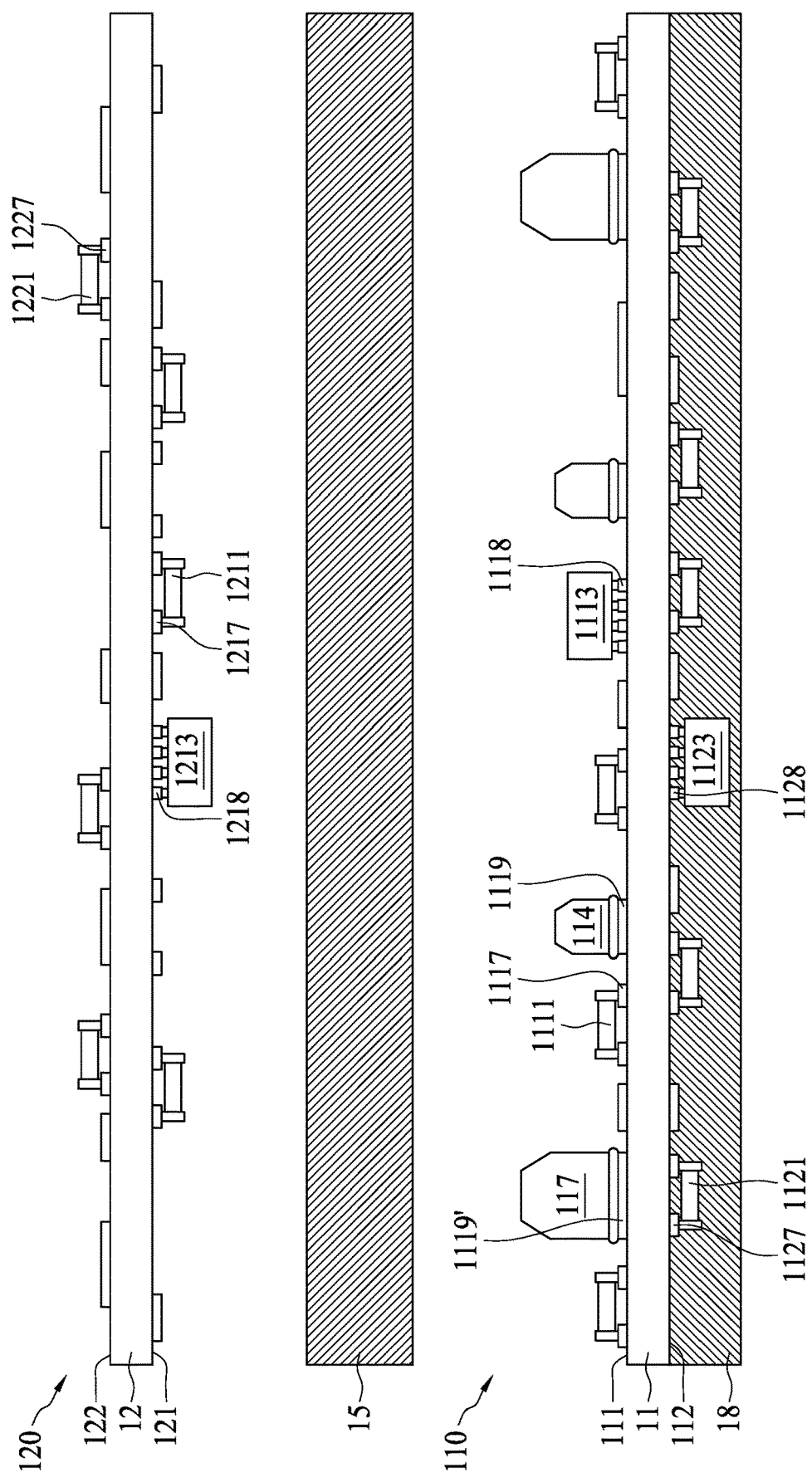

In FIG. 2D, a double side module (DSM) 120 and an encapsulant 15 are provided. In some embodiments, the encapsulant 15 includes a liquid adhesion. In some embodiments, the encapsulant 15 includes an adhesive film. In some embodiments, the encapsulant 15 includes an adhesive tape. The double side module 120 includes a substrate 12. The substrate 12 includes a surface 121 facing the surface 111 of the substrate 11 and a surface 122 opposite to the surface 111. Electronic components 1211 and 1213 are disposed on the surface 121 of the substrate 12. Further, electronic components 1221 are disposed on the surface 122 of the substrate 12. In some embodiments, the electronic components 1221 are mounted to the surface 122 of the substrate 12 by electrical connections 1227, and the electrical connections 1227 are made of the second solder material.

Figure 2E:
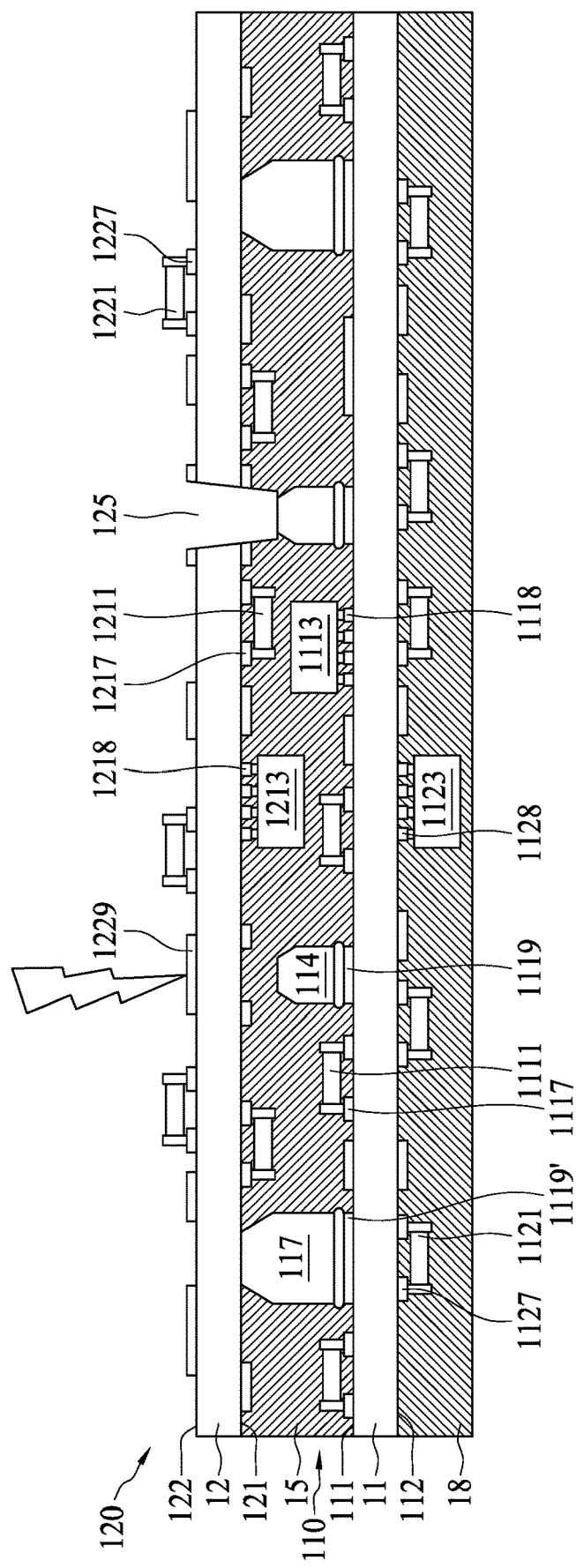

In FIG. 2E, the double side module 120 is arranged above the double side module 110 and the encapsulant 15 is arranged between the substrate 11 and the substrate 12. The spacers 117 contact with the surface 121 of the substrate 12 and thus support the substrate 12. The encapsulant 15 encapsulates the electronic components 1211 and 1213, the surface 121 of the substrate 12, the electronic components 1121 and 1123, the connectors 114, the spacers 117 and the surface 111 of the substrate 11. Referring to FIG. 2E, a laser operation may be carried out such that a portion of the substrate 12 and a portion of the encapsulant 15 can be removed by the laser operation. After the laser operation, a tapered through hole 125 is formed and a portion of the connection 114 is exposed. In some embodiments, a small portion of the pad 1229 disposed on the surface 122 of the substrate 12 can be removed by the laser operation.

Figure 2F:
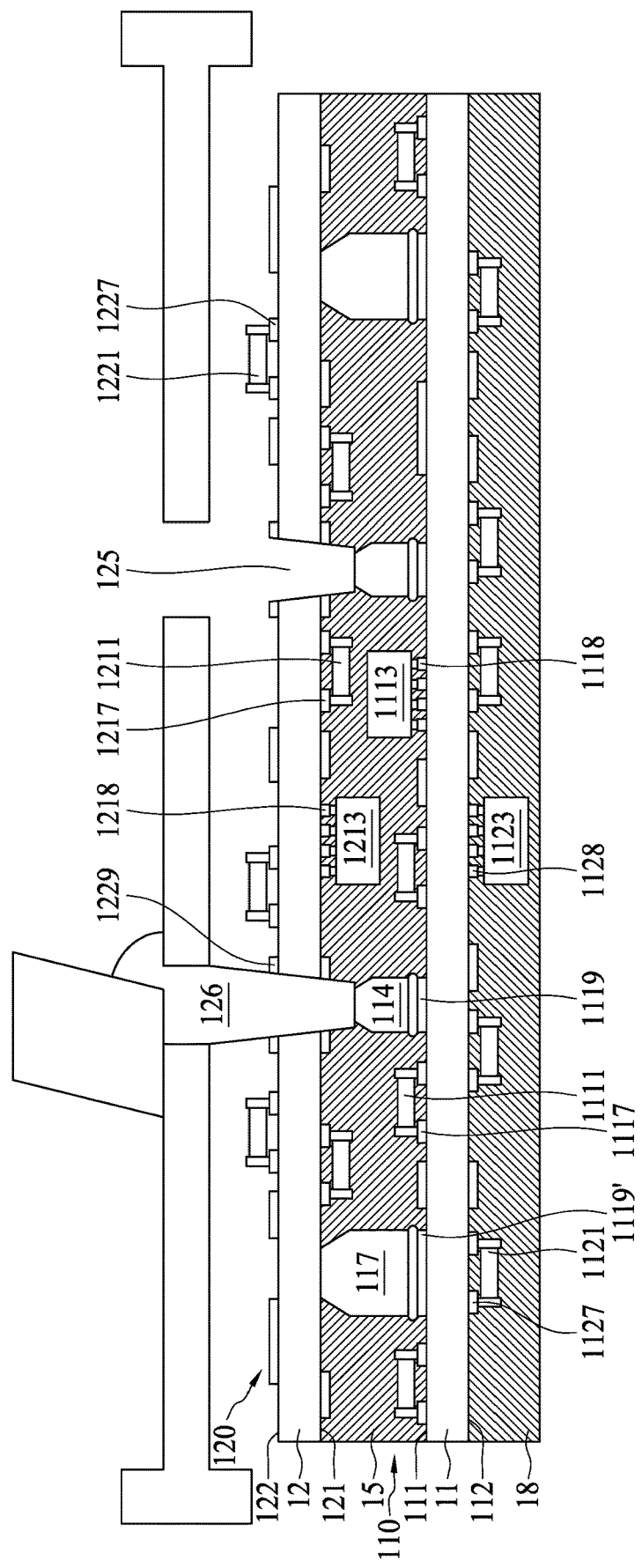

In FIG. 2F, conductors 126 are filled in the through holes 125 by a screen printing operation. Thus, the conductor 126 passes through the substrate 12 and contacts with the connector 114. Further, since the through hole 125 is tapered, the conductor 126 is substantially tapered. In some embodiments, the conductor 126 is made of the third solder material.

Figure 2G:
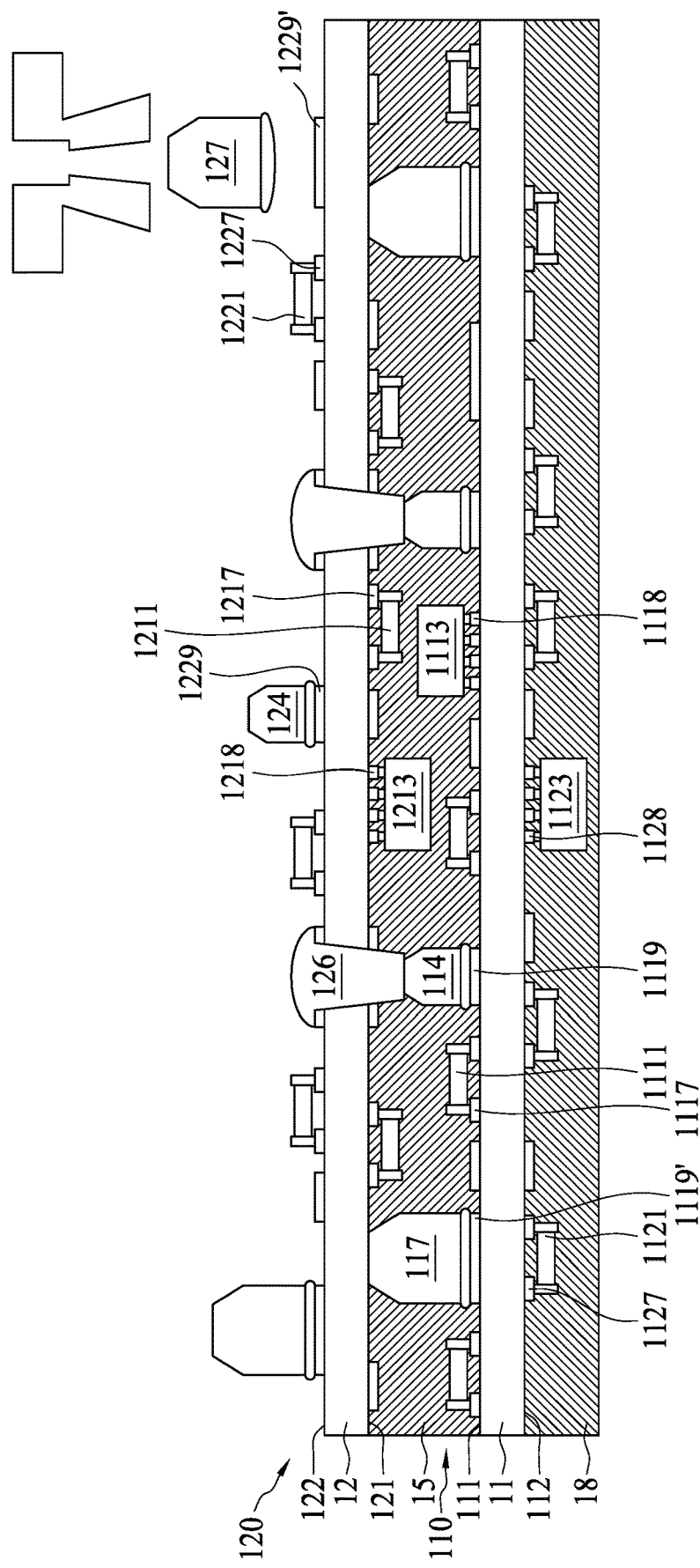

In FIG. 2G, connectors 124 and spacers 127 are arranged on the surface 122 of the substrate 12. In some embodiments, the connectors 124 and the spacers 127 are arranged on the pads 1229, and the third solder material is arranged between the connector 124 and the pad 1229 and between the spacer 127 and the pad 1229.

Figure 2H:
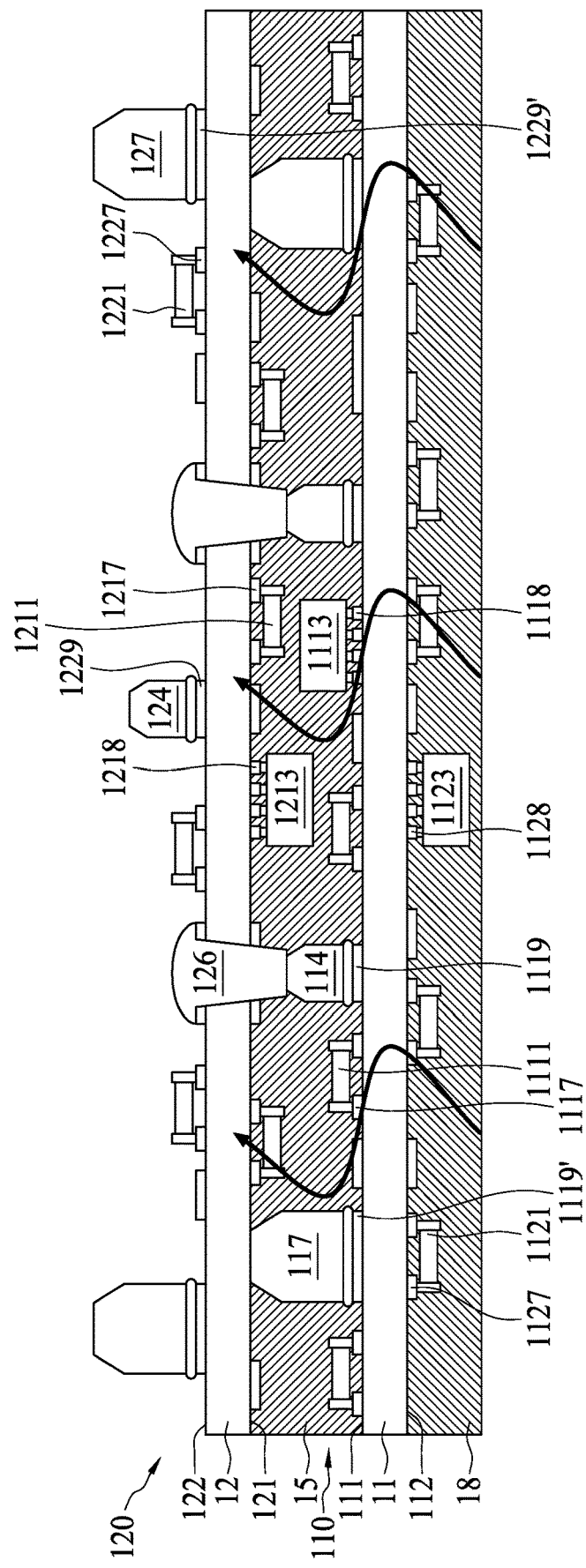

In FIG. 2H, a reflow process may be carried out such that the connectors 124 and the spacers 127 are mounted to the substrate 12 and the conductors 126 are formed. A melting point of the second solder material is greater than a melting point the third solder material. Thus, the melting point of the second solder material is greater than the reflow temperature. That is, the electronic components 1221 disposed on the surface 122 of the substrate 12 would not be affected by the high temperature during the reflow process.

Figure 2I:
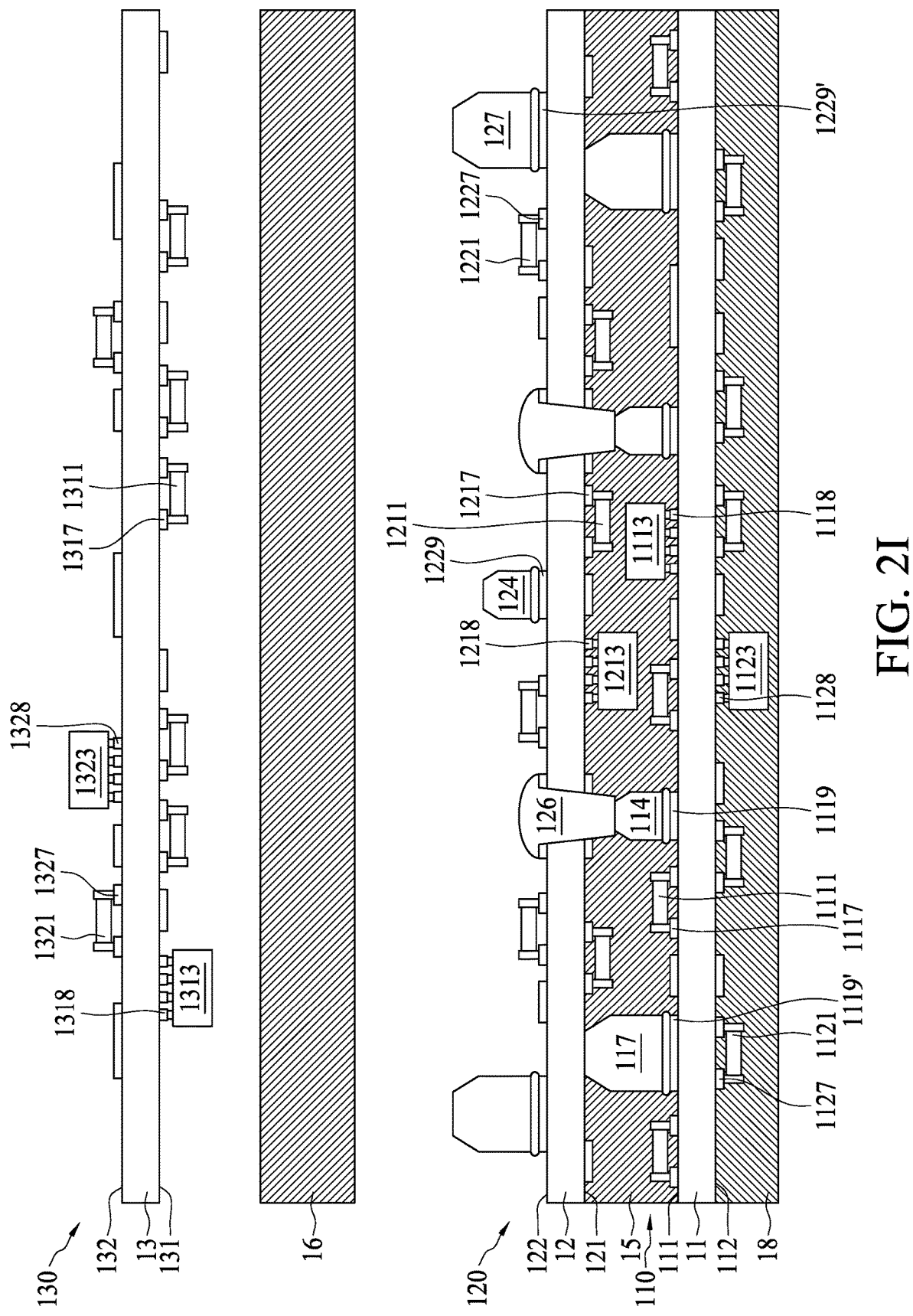

In FIG. 2I, a double side module (DSM) 130 and an encapsulant 16 are provided. In some embodiments, the encapsulant 16 includes a liquid adhesion. In some embodiments, the encapsulant 16 includes an adhesive film. In some embodiments, the encapsulant 16 includes an adhesive tape. The double side module 130 includes a substrate 13. The substrate 13 includes a surface 131 facing the surface 122 of the substrate 12 and a surface 132 opposite to the surface 131. Electronic components 1311 and 1313 are disposed on the surface 131 of the substrate 13. Further, electronic components 1321, 1323 are disposed on the surface 132 of the substrate 13. In some embodiments, the electronic components 1321, 1322 are mounted to the surface 132 of the substrate 13 by electrical connections 1327 and 1328, and the electrical connections 1327 and 1328 are made of the third solder material.

Figure 2J:
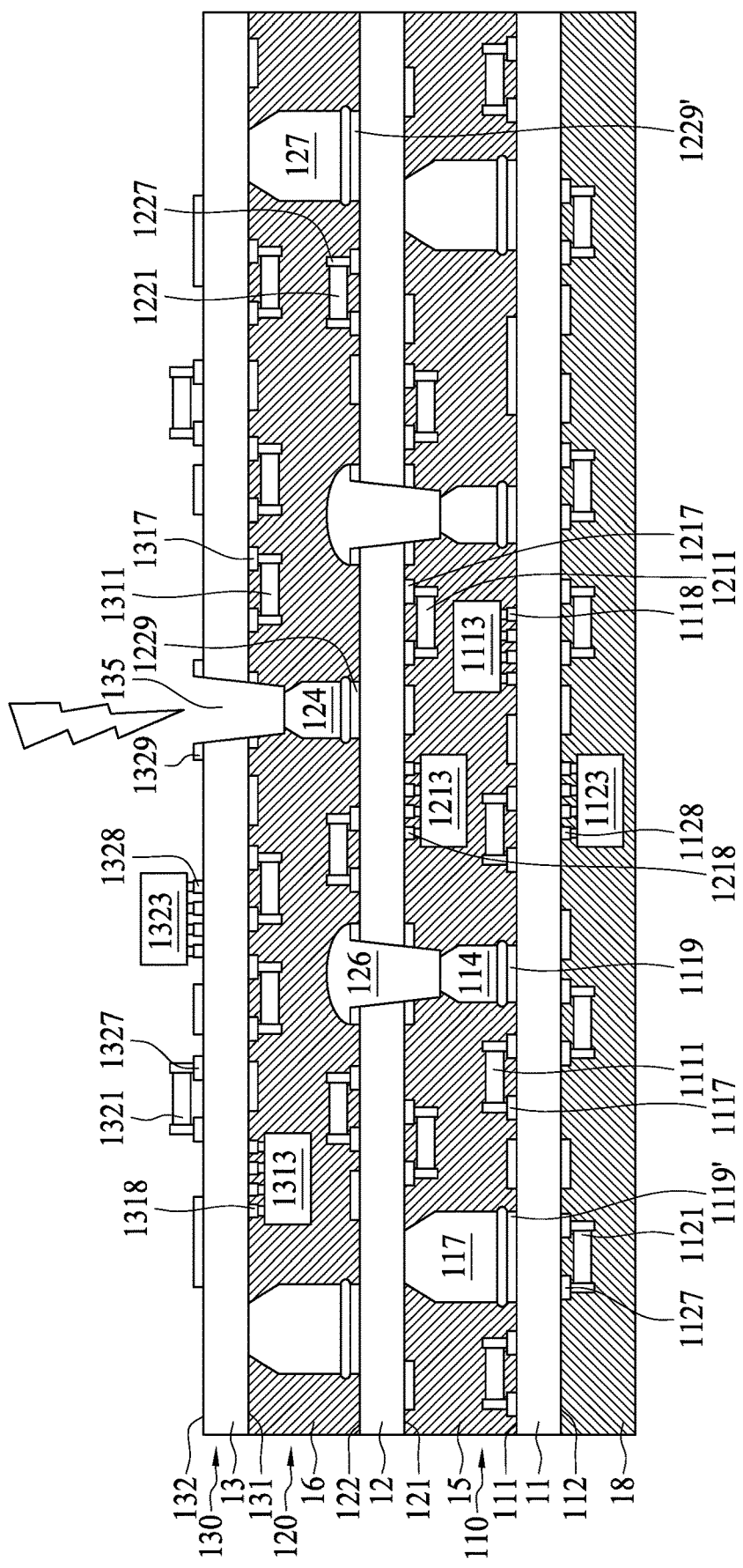

In FIG. 2J, the double side module 130 is arranged above the double side module 120 and the encapsulant 16 is arranged between the substrate 12 and the substrate 13. The spacers 127 contact with the surface 131 of the substrate 13 and thus support the substrate 13. The encapsulant 16 encapsulates the electronic components 1311 and 1313, the surface 131 of the substrate 13, the electronic components 1221, the connectors 124, the spacers 127 and the surface 122 of the substrate 12. Referring to FIG. 2J, a laser operation may be carried out such that a portion of the substrate 13 and a portion of the encapsulant 16 can be removed by the laser operation. After the laser operation, a tapered through hole 135 is formed and a portion of the connection 124 is exposed. In some embodiments, a small portion of the pad 1329 disposed on the surface 132 of the substrate 13 can be removed by the laser operation.

Figure 2K:
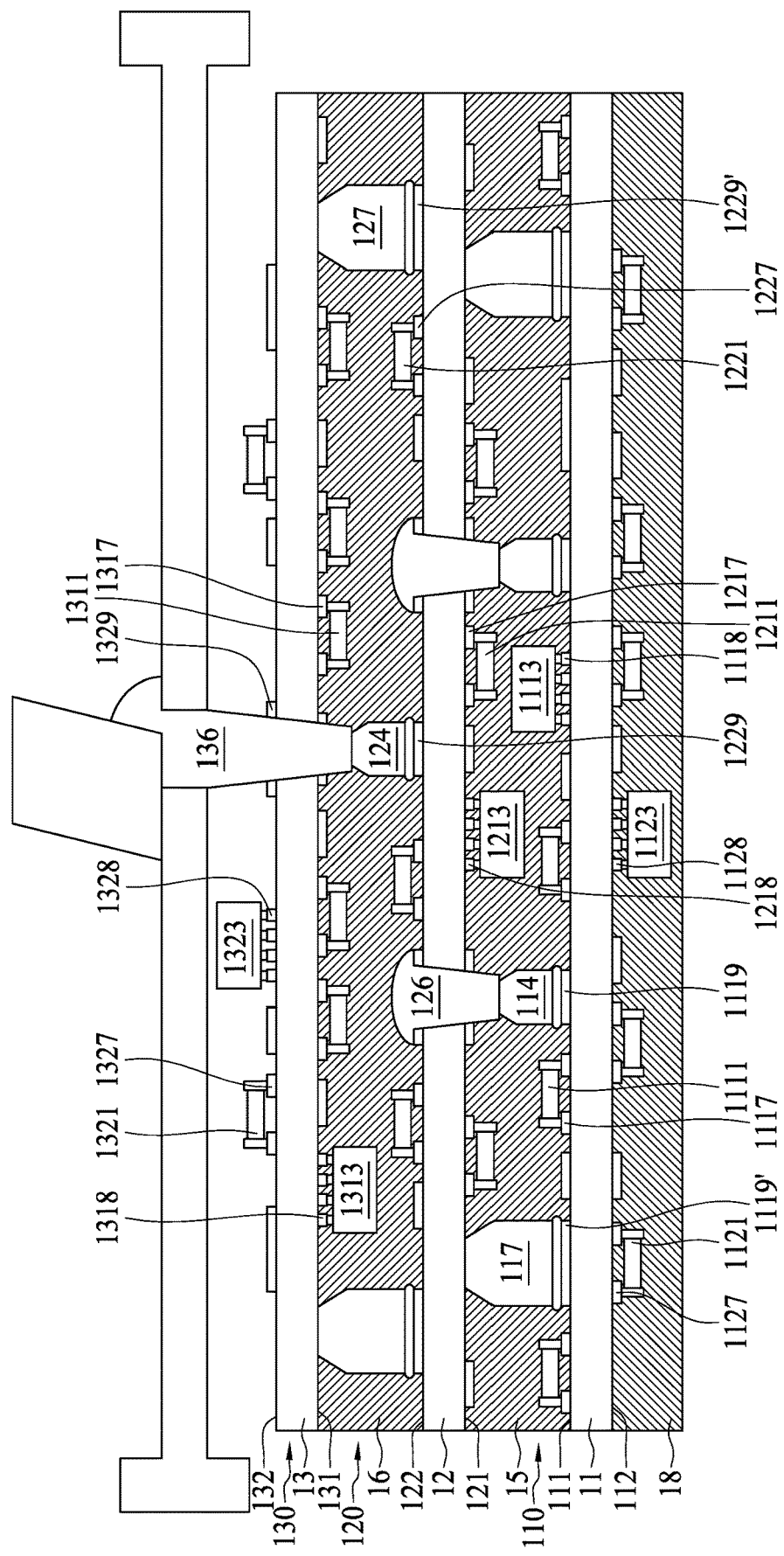

In FIG. 2K, conductors 136 are filled in the through holes 135 by a screen printing operation. Thus, the conductor 136 passes through the substrate 13 and contacts with the connector 124. Further, since the through hole 135 is tapered, the conductor 136 is substantially tapered. In some embodiments, the conductor 136 is made of the fourth solder material.

Figure 2L:
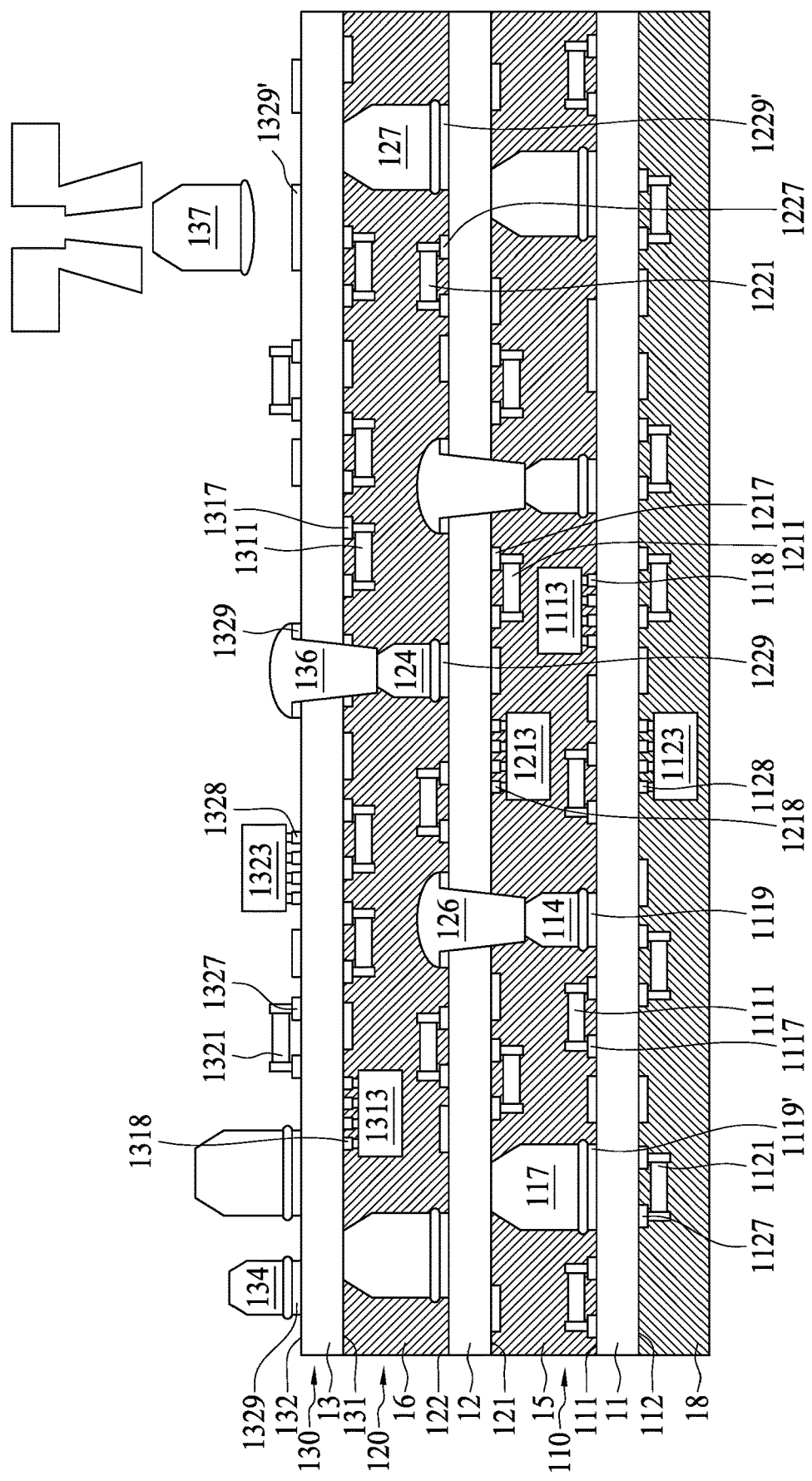

In FIG. 2L, connectors 134 and spacers 137 are arranged on the surface 132 of the substrate 13. In some embodiments, the connectors 134 and the spacers 137 are arranged on the pads 1329, and the fourth solder material is arranged between the connector 134 and the pad 1329 and between the spacer 137 and the pad 1329.

Figure 2M:
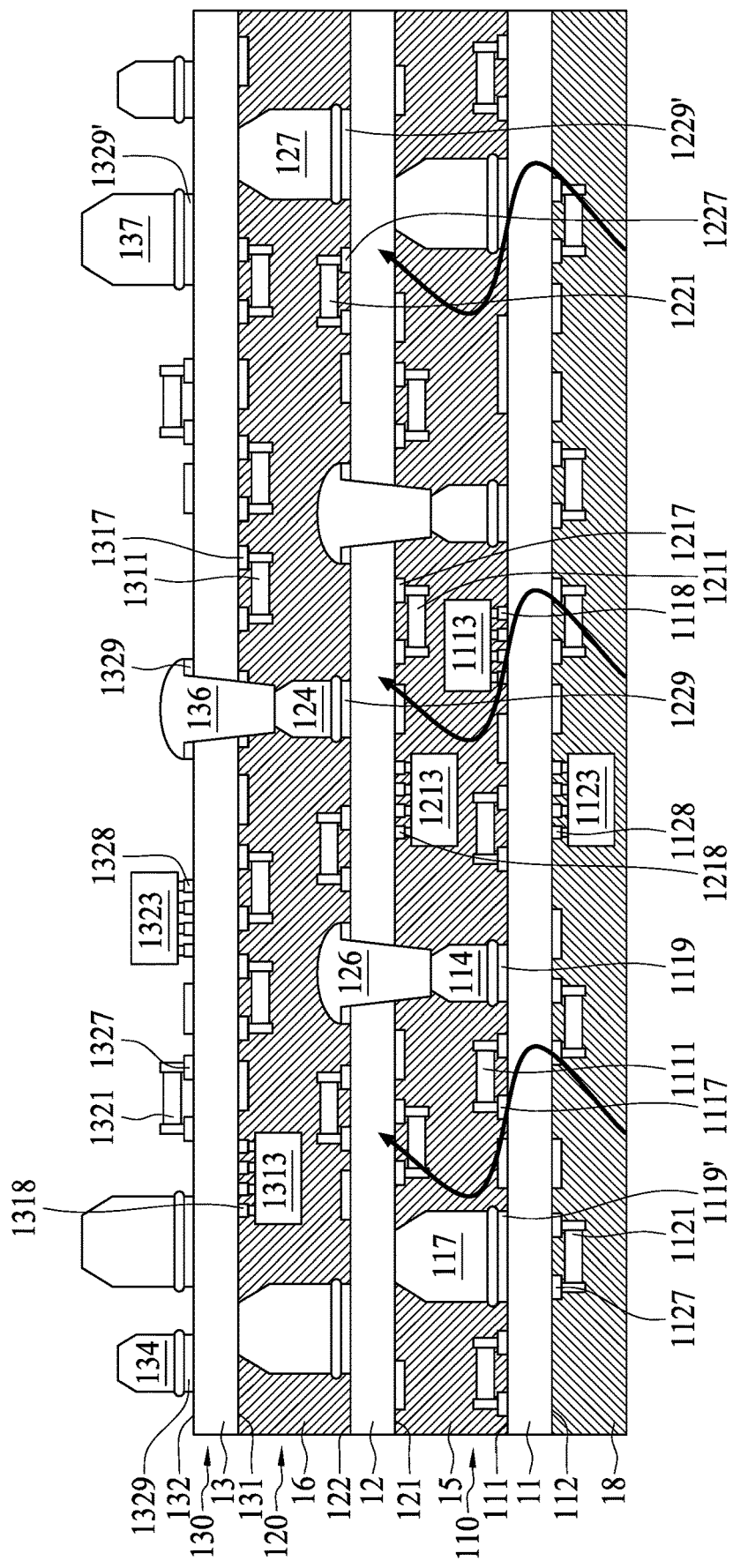

In FIG. 2M, a reflow process may be carried out such that the connectors 134 and the spacers 137 are mounted to the substrate 13 and the conductor 136 are formed. A melting point of the third solder material is greater than a melting point the fourth solder material. Thus, the melting point of the third solder material is greater than the reflow temperature. That is, the electronic components 1321, 1323 disposed on the surface 132 of the substrate 13 and the conductor 126 would not be affected by the high temperature during the reflow process.

Figure 2N:
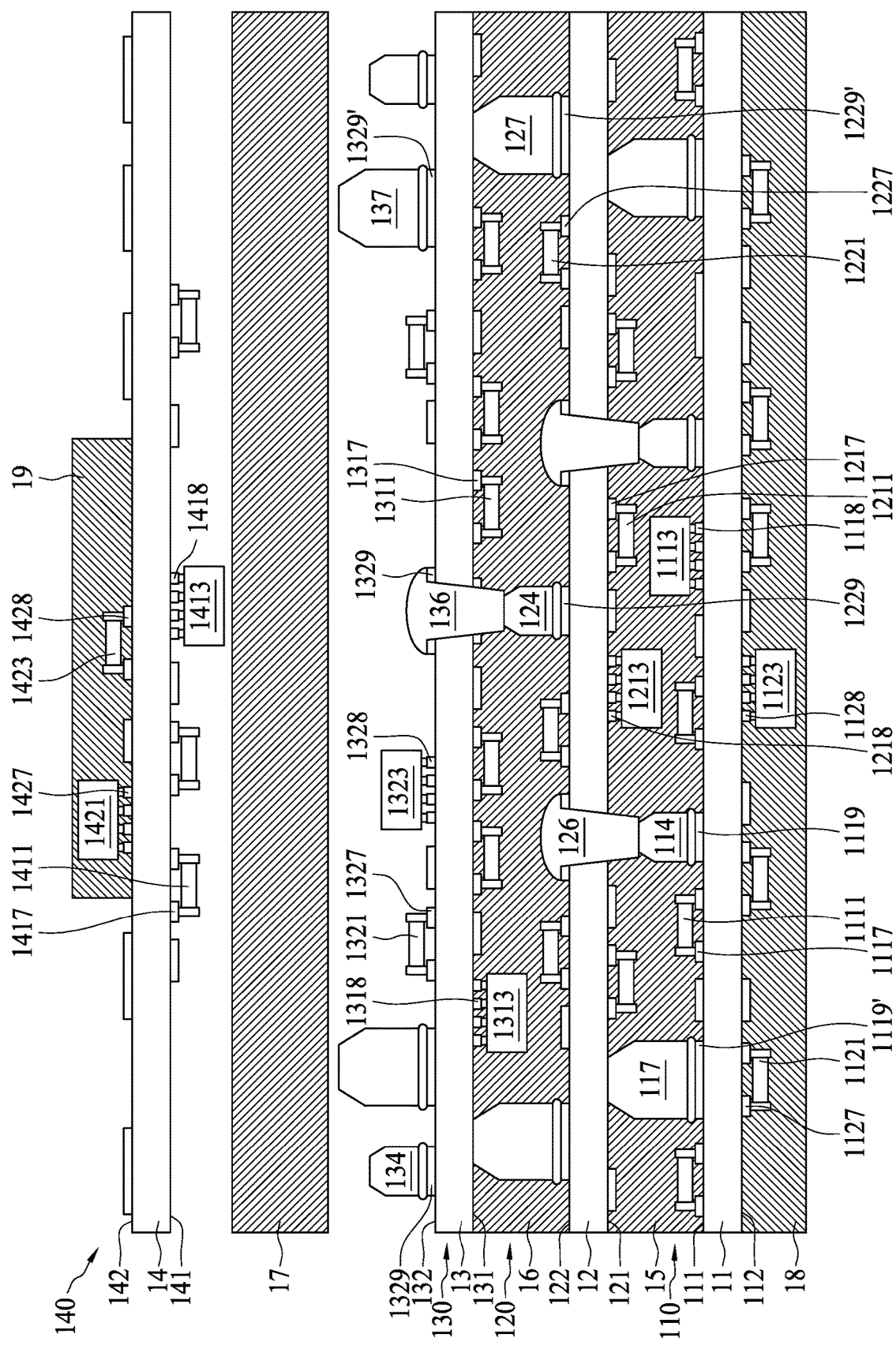

In FIG. 2N, a double side module (DSM) 140 and an encapsulant 17 are provided. In some embodiments, the module 140 may be a single side module. In some embodiments, the encapsulant 17 includes a liquid adhesion. In some embodiments, the encapsulant 17 includes an adhesive film. In some embodiments, the encapsulant 17 includes an adhesive tape. The double side module 140 includes a substrate 14. The substrate 14 includes a surface 141 facing the surface 132 of the substrate 13 and a surface 142 opposite to the surface 141. Electronic components 1411 and 1413 are disposed on the surface 141 of the substrate 14. Further, electronic components 1421, 1423 and an encapsulant 19 are disposed on the surface 142 of the substrate 14, and the encapsulant 19 encapsulates the electronic components 1421, 1423 and a portion of the surface 142 of the substrate 14.

Figure 2O:
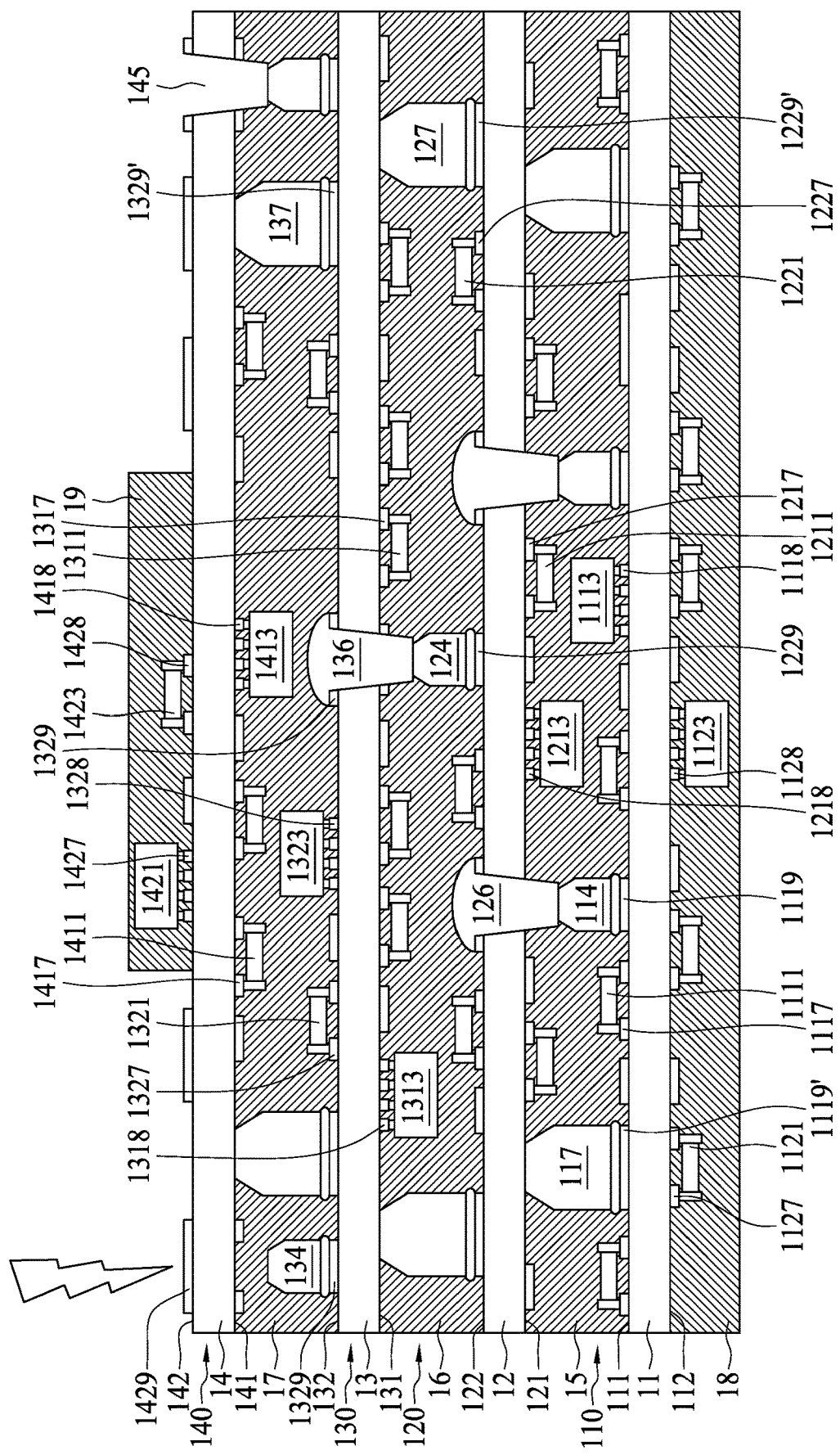

In FIG. 2O, the double side module 140 is arranged above the double side module 130 and the encapsulant 17 is arranged between the substrate 13 and the substrate 14. The spacers 137 contact with the surface 141 of the substrate 14 and thus support the substrate 14. The encapsulant 17 encapsulates the electronic components 1411 and 1413, the surface 141 of the substrate 14, the electronic components 1321 and 1323, the connectors 134, the spacers 137 and the surface 132 of the substrate 13. Referring to FIG. 2O, a laser operation may be carried out such that a portion of the substrate 14 and a portion of the encapsulant 17 can be removed by the laser operation. After the laser operation, a tapered through hole 145 is formed and a portion of the connection 134 is exposed. In some embodiments, a small portion of the pad 1429 disposed on the surface 142 of the substrate 14 can be removed by the laser operation.

Figure 2P:
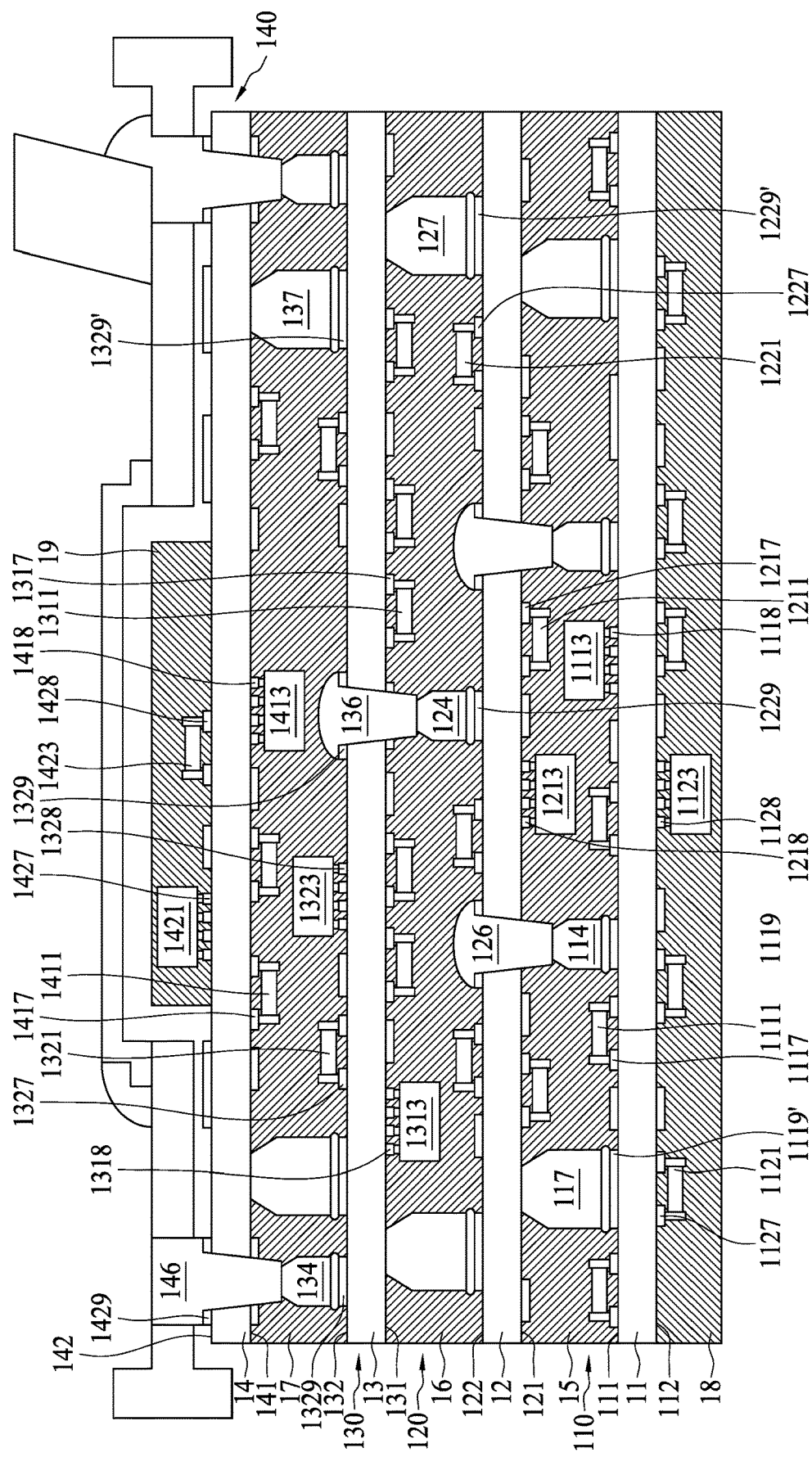

In FIG. 2P, conductors 146 are filled in the through holes 134 by a screen printing operation. Thus, the conductor 146 passes through the substrate 14 and contacts with the connector 134. Further, since the through hole 145 is tapered, the conductor 146 is substantially tapered. In some embodiments, the conductor 146 is made of the fifth solder material.

Figure 2Q:
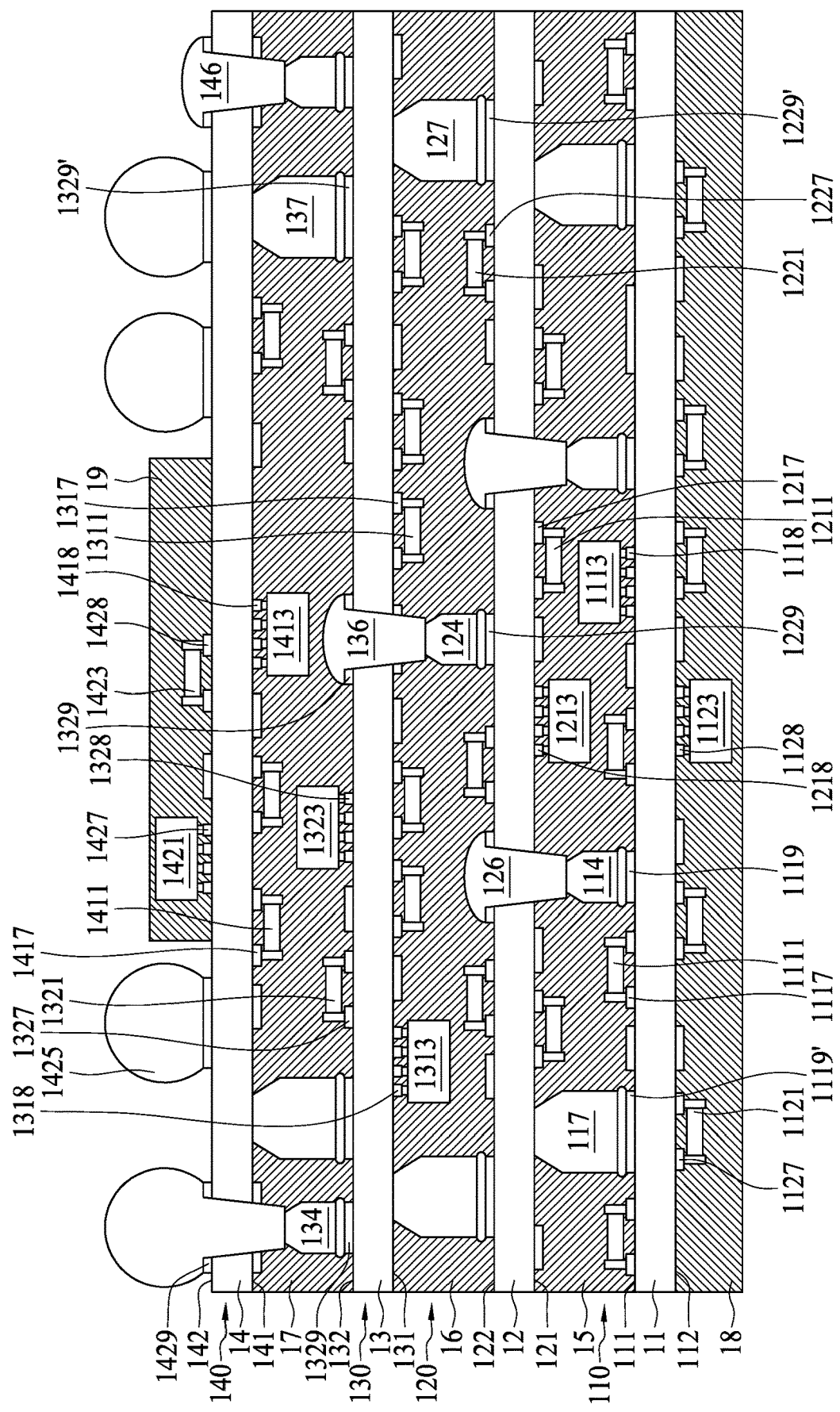

In FIG. 2Q, electrical connections 1425, such as solder balls, are disposed on the surface 142 of the substrate 14. The electrical connections 1425 are located at the region that is not covered by the encapsulant 19. In some embodiments, the electrical connection is made of the fifth solder material.

Figure 2R:
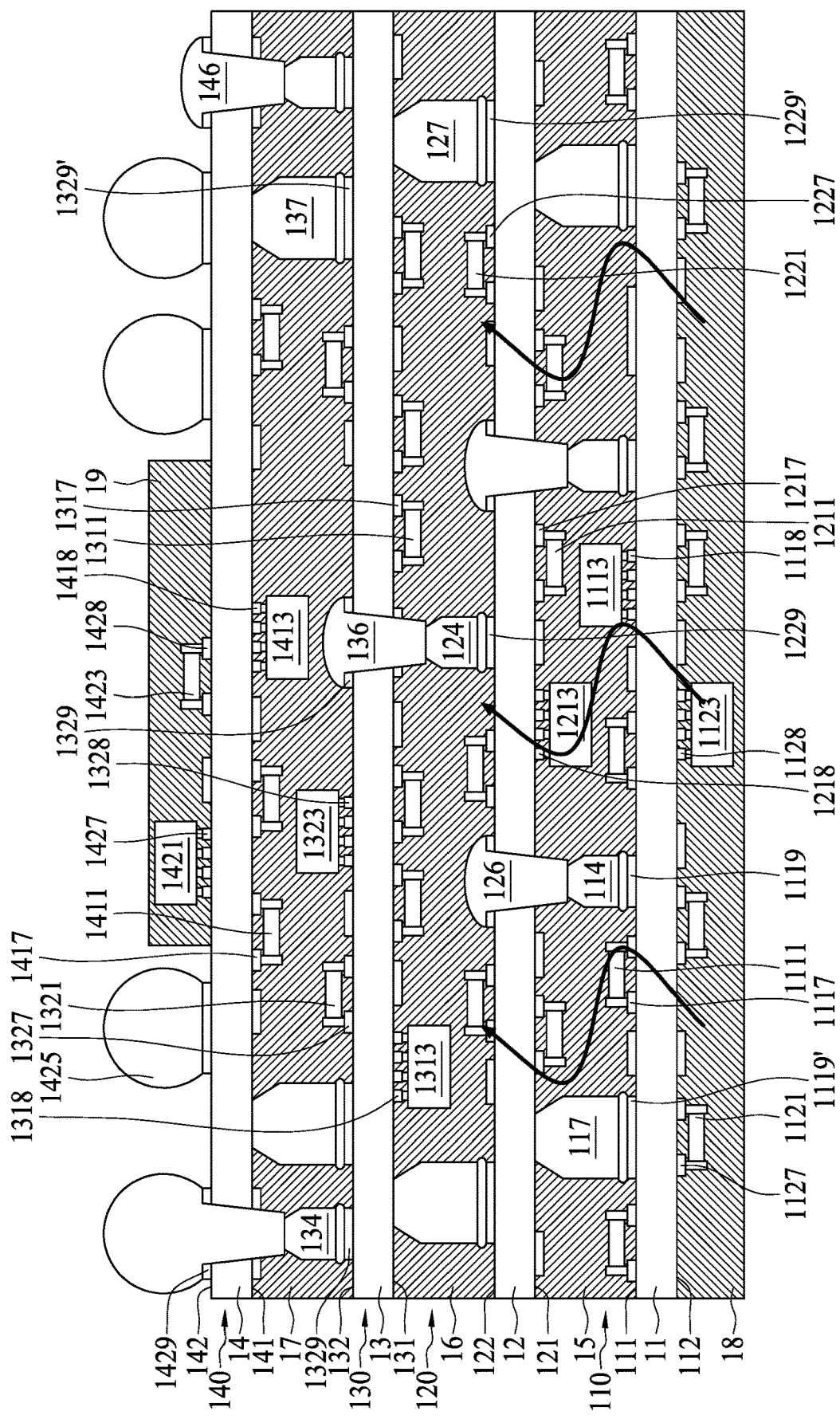

In FIG. 2R, a reflow process may be carried out such that the conductors 146 and the electrical 1425 are formed. A melting point of the fourth solder material is greater than a melting point the fifth solder material. Thus, the melting point of the third solder material and the melting point of the fourth solder material are greater than the reflow temperature. That is, the conductors 126 and 136 would not be affected by the high temperature during the reflow process.

Figure 2S:
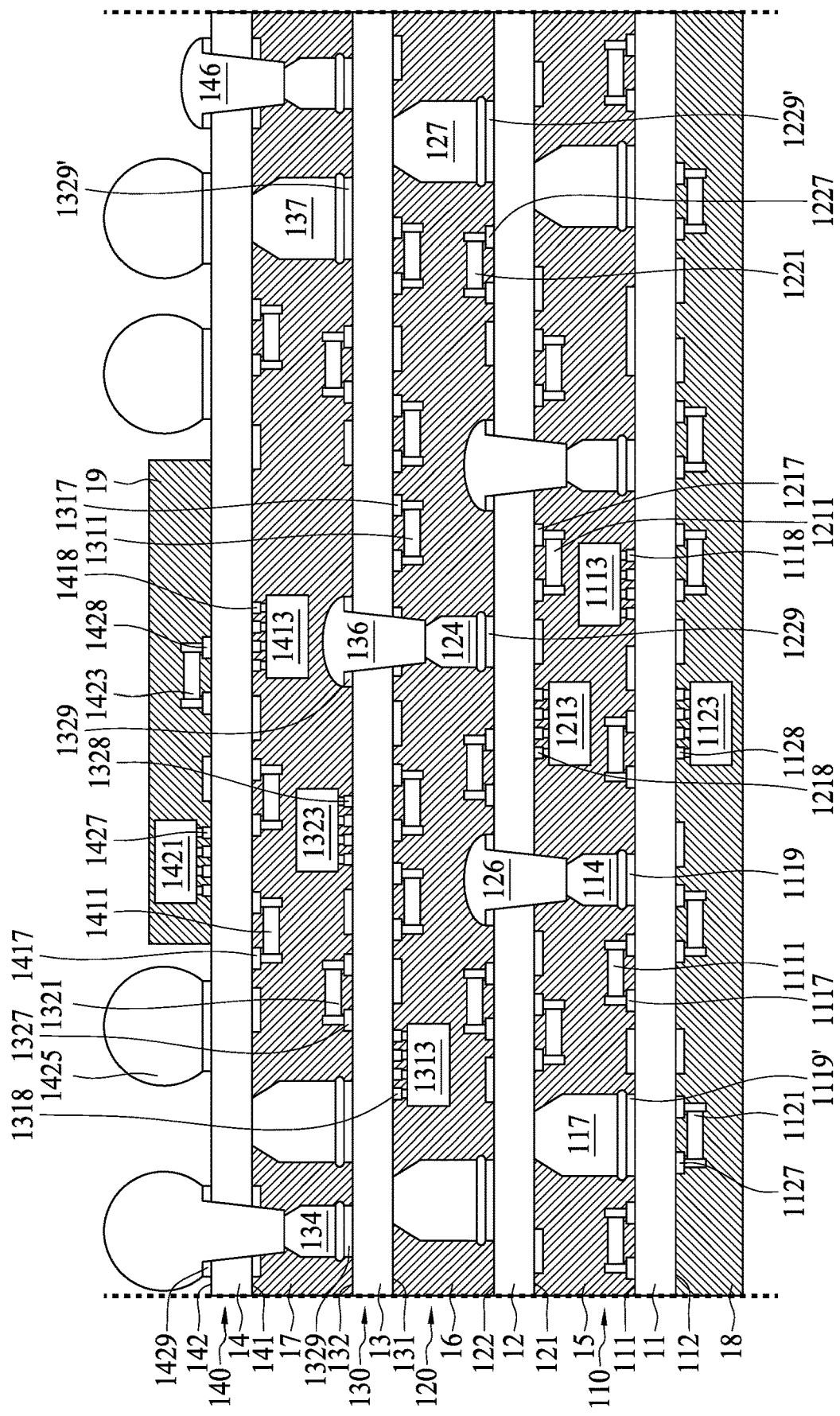

In FIG. 2S, a singulation process is conducted to singulate the modules 110, 120, 130 and 140 to form a semiconductor device package 1 as shown in FIG. 1.

Figure 3:
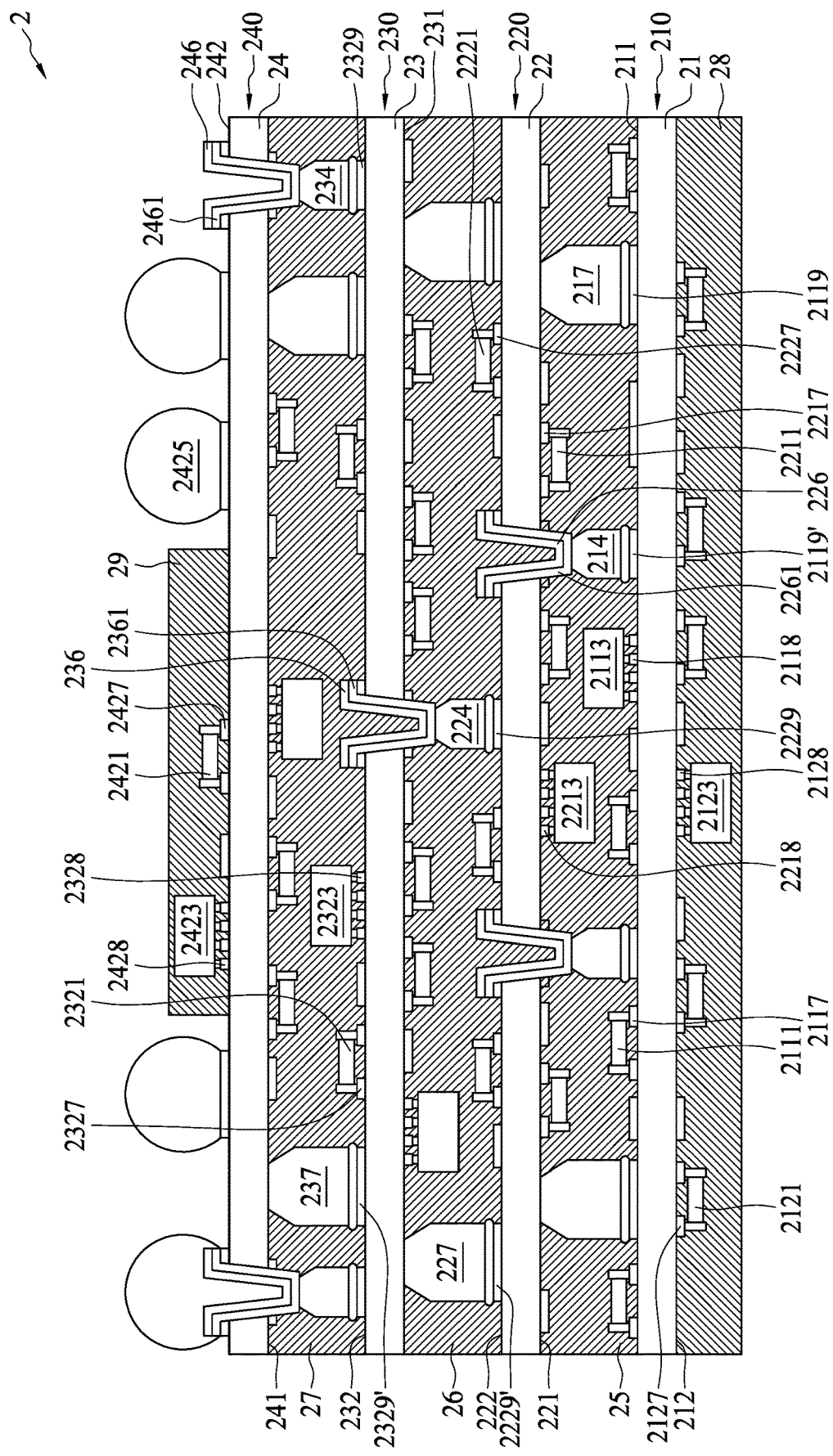
FIG. 3 is a cross-sectional view of a semiconductor device package in accordance with an embodiment of the instant disclosure.

FIG. 3 is a cross-sectional view of a semiconductor device package 2 in accordance with some embodiments of the present disclosure. As shown in FIG. 3, the semiconductor device 2 includes four double side modules (DSM) 210, 220, 230 and 240. The double side module 210 includes a substrate 21 with a surface 211 (e.g., an upper surface) and a surface 212 (e.g., a lower surface) opposite to the surface 211. Electronic components 2121 and 2123 are disposed on the surface 212 of the substrate 21. In some embodiments, the electronic components 2121 are mounted to the surface 212 of the substrate 21 by electrical connections 2127, and the electronic component 2123 is mounted to the surface 212 of the substrate 21 by electrical connections 2128. An encapsulant 28 encapsulates the electronic components 2121, 2123 and the surface 212 of the substrate 21. The encapsulant 28 may include molding compounds such epoxy resin, and fillers such as silicon oxide fillers may be filled in the molding compound. In addition, the encapsulant 28 may include a molding underfill (MUF) or a capillary underfill (CUF). Further, electronic components 2111 and 2113 are disposed on the surface 211 of the substrate 21. In some embodiments, the electronic components 2111 are mounted to the surface 211 of the substrate 21 by electrical connections 2117, and the electronic component 2113 is mounted to the surface 211 of the substrate 21 by electrical connections 2118. In addition, connectors 214 and spacers 217 are disposed on the surface 211 of the substrate 21. Generally, a height of the spacer 217 is larger than a height of the connector 214. In some embodiments, the connectors 214 and the spacers 217 are mounted to the surface 211 of the substrate 21 by pads 2119, 2119'. Moreover, in some embodiments, a distance between two spacers 217 is larger than a half of width of the substrate 21. In some embodiments, the spacer 217 is made of metal material. In some embodiments, the spacer 217 is made of non-metal material. Moreover, the connector 214 may have a tapered upper end, and the spacer 217 may have a tapered upper end. The height ratio of the connector 214 to the spacer 217 ranges from 0.4 to 1.0.

The double side module 220 includes a substrate 22 with a surface 221 (e.g., a lower surface) facing the surface 211 of the substrate 21 and a surface 222 opposite to the surface 221. Electronic components 2211 and 2213 are disposed on the surface 221 of the substrate 22. In some embodiments, the electronic components 2211 are mounted to the surface 221 of the substrate 22 by electrical connections 2217, and the electronic component 2213 is mounted to the surface 221 of the substrate 22 by electrical connections 2218. Further, the spacers 217 contact with the surface 221 of the substrate 22. In other words, the spacers 217 support the substrate 22. Thus, the distance between the surface 211 of the substrate 21 and the surface 221 of the substrate 22 is defined by the height of the spacer 217. Therefore, the ratio of the height of the connector 214 to the distance between the surface 211 of the substrate 21 and the surface 221 of the substrate 22 ranges from 0.4 to 1.0. In some embodiments, the spacer 217 is made of metal material, and thus the substrates 21 and 22 are electrically connected to each other by the spacer 217. Further, electronic components 2221 are disposed on the surface 222 of the substrate 22. In some embodiments, the electronic components 2221 are mounted to the surface 222 of the substrate 22 by electrical connections 2227. In addition, connectors 224 and spacers 227 are disposed on the surface 222 of the substrate 22. Generally, a height of the spacer 227 is larger than a height of the connector 224. In some embodiments, the connectors 224 and the spacers 227 are mounted to the surface 222 of the substrate 22 by pads 2229. Moreover, a distance between two spacers 227 is larger than a half of width of the substrate 22. In some embodiments, the spacer 227 is made of metal material. In some embodiments, the spacer 227 is made of non-metal material. Moreover, the connector 224 may have a tapered upper end, and the spacer 227 may have a tapered upper end. The height ratio of the connector 224 to the spacer 227 ranges from 0.4 to 1.0. In addition, the double side module 220 includes conductors 226 passing through or penetrating the substrate 22 and electrically connecting to the connectors 214. In some embodiments, the conductor 126 is made of alloys, such as Cu, Ag, Au, Ni alloys. An encapsulant 25 is arranged between the substrates 21 and 22 and encapsulates the electronic components 2111, 2113, the connectors 214, and the surface 212 of the substrate 21, the electronic components 2211, 2213, the surface 221 of the substrate 12 and portions of the conductors 226. In some embodiments, the encapsulant 25 may include a liquid adhesion. In some embodiments, the encapsulant 25 may include an adhesive tape. In some embodiments, the encapsulant 25 may include an adhesive film.

As shown in FIG. 3, the conductor 226 passes through the substrate 22 and connects to the top of the connector 214. Thus, the modules 210 and 220 can be electrically connected to each other by the conductor 226 and the connector 214. The conductor 226 may be tapered from its upper end to its lower end. Referring to FIG. 3, the conductor 226 has a cross-sectional V shape. In some embodiments, the conductor 226 has a seed layer 2261. The seed layer 2261 is substantially disposed on the outer surface of the conductor 226. Thus, the seed layer 2261 is substantially arranged between the conductor 226 and the substrate 22 and substantially arranged between the conductor 226 and the encapsulant 25 and substantially arranged between the conductor 226 and the connector 214.

The double side module 230 includes a substrate 23 with a surface 231 (e.g., a lower surface) facing the surface 222 of the substrate 22 and a surface 232 opposite to the surface 231. Electronic components 2311 and 2313 are disposed on the surface 231 of the substrate 13. In some embodiments, the electronic components 2311 are mounted to the surface 231 of the substrate 23 by electrical connections 2317, and the electronic component 2313 is mounted to the surface 231 of the substrate 23 by electrical connections 2318. Further, the spacers 227 contact with the surface 231 of the substrate 23. In other words, the spacers 227 support the substrate 23. Thus, the distance between the surface 222 of the substrate 22 and the surface 231 of the substrate 23 is defined by the height of the spacer 227. Therefore, the ratio of the height of the connector 224 to the distance between the surface 222 of the substrate 22 and the surface 231 of the substrate 23 ranges from 0.4 to 1.0. In some embodiments, the spacer 227 is made of metal material, and thus the substrates 22 and 23 are electrically connected to each other by the spacer 227. Further, electronic components 2321 and 2323 are disposed on the surface 232 of the substrate 23. In some embodiments, the electronic components 2321 are mounted to the surface 232 of the substrate 23 by electrical connections 2327, and the electronic component 2323 is mounted to the surface 232 of the substrate 23 by electrical connections 2328. In addition, connectors 234 and spacers 237 are disposed on the surface 232 of the substrate 23. Generally, a height of the spacer 237 is larger than a height of the connector 234. In some embodiments, the connectors 234 and the spacers 237 are mounted to the surface 232 of the substrate 23 by pads 2329, 2329'. Moreover, a distance between two spacers 237 is larger than a half of width of the substrate 23. In some embodiments, the spacer 237 is made of metal material. In some embodiments, the spacer 237 is made of non-metal material. Moreover, the connector 234 may have a tapered upper end, and the spacer 237 may have a tapered upper end. The height ratio of the connector 234 to the spacer 237 ranges from 0.4 to 1.0. In addition, the double side module 230 includes a conductor 236 passing through or penetrating the substrate 23 and electrically connecting to the connectors 224. In some embodiments, the conductor 236 is made of alloys, such as Cu, Ag, Au, Ni alloys. An encapsulant 26 is arranged between the substrates 22 and 23 and encapsulates the electronic components 2221, 2223, the connectors 224, and the surface 222 of the substrate 22, the electronic components 2311, 2313, the surface 231 of the substrate 23 and portions of the conductors 236. In some embodiments, the encapsulant 26 may include a liquid adhesion. In some embodiments, the encapsulant 26 may include an adhesive tape. In some embodiments, the encapsulant 26 may include an adhesive film.

As shown in FIG. 3, the conductor 236 passes through the substrate 23 and connects to the top of the connector 224. Thus, the modules 220 and 230 can be electrically connected to each other by the conductor 236 and the connector 224. The conductor 236 may be tapered from its upper end to its lower end. Referring to FIG. 3, the conductor 236 has a cross-sectional V shape. In some embodiments, the conductor 236 has a seed layer 2361. The seed layer 2361 is substantially disposed on the outer surface of the conductor 236. Thus, the seed layer 2361 is substantially arranged between the conductor 236 and the substrate 23 and substantially arranged between the conductor 236 and the encapsulant 26 and substantially arranged between the conductor 236 and the connector 224.

The double side module 240 includes a substrate 24 with a surface 241 (e.g., a lower surface) facing the surface 232 of the substrate 23 and a surface 242 opposite to the surface 241. Electronic components 2411 and 2413 are disposed on the surface 241 of the substrate 24. In some embodiments, the electronic components 2411 are mounted to the surface 241 of the substrate 24 by electrical connections 2417, and the electronic component 2413 is mounted to the surface 241 of the substrate 24 by electrical connections 2418. Further, the spacers 237 contact with the surface 241 of the substrate 24. In other words, the spacers 237 support the substrate 24. Thus, the distance between the surface 232 of the substrate 23 and the surface 241 of the substrate 24 is defined by the height of the spacer 237. Therefore, the ratio of the height of the connector 234 to the distance between the surface 232 of the substrate 23 and the surface 241 of the substrate 24 ranges from 0.4 to 1.0. In some embodiments, the spacer 237 is made of metal material, and thus the substrates 23 and 24 are electrically connected to each other by the spacer 237. Further, electronic components 2421 and 2423 are disposed on the surface 242 of the substrate 24. In some embodiments, the electronic component 2421 is mounted to the surface 242 of the substrate 24 by electrical connections 2427, and the electronic component 2423 is mounted to the surface 242 of the substrate 24 by electrical connections 2428. An encapsulant 29 disposed on the surface 242 of the substrate 24 and encapsulates the electronic components 2421 and 2423 and a portion of the surface 242 of the substrate 24. The encapsulant 29 may include molding compounds such epoxy resin, and fillers such as silicon oxide fillers may be filled in the molding compound. In addition, the encapsulant 29 may include a molding underfill (MUF) or a capillary underfill (CUF). Further, electrical connections 2425, such as solder balls, are disposed on the surface 242 of the substrate 24. In some embodiments, the electrical connections 2425 are not covered by the encapsulant 29. In addition, the double side module 240 includes conductors 246 passing through or penetrating the substrate 24 and electrically connecting to the connectors 234. In some embodiments, the conductor 246 is made of alloys, such as Cu, Ag, Au, Ni alloys. An encapsulant 27 is arranged between the substrates 23 and 24 and encapsulates the electronic components 2321, 2323, the connectors 234, and the surface 232 of the substrate 23, the electronic components 2411, 2413, the surface 241 of the substrate 24 and portions of the conductors 246. In some embodiments, the encapsulant 27 may include a liquid adhesion. In some embodiments, the encapsulant 27 may include an adhesive tape. In some embodiments, the encapsulant 27 may include an adhesive film.

As shown in FIG. 3, the conductor 246 passes through the substrate 24 and connects to the top of the connector 234. Thus, the modules 230 and 240 can be electrically connected to each other by the conductor 246 and the connector 234. The conductor 246 may be tapered from its upper end to its lower end. Referring to FIG. 3, the conductor 246 has a cross-sectional V shape. In some embodiments, the conductor 246 has a seed layer 2461. The seed layer 2461 is substantially disposed on the outer surface of the conductor 246. Thus, the seed layer 2461 is substantially arranged between the conductor 246 and the substrate 24 and substantially arranged between the conductor 246 and the encapsulant 27 and substantially arranged between the conductor 246 and the connector 234.

Figure 4:
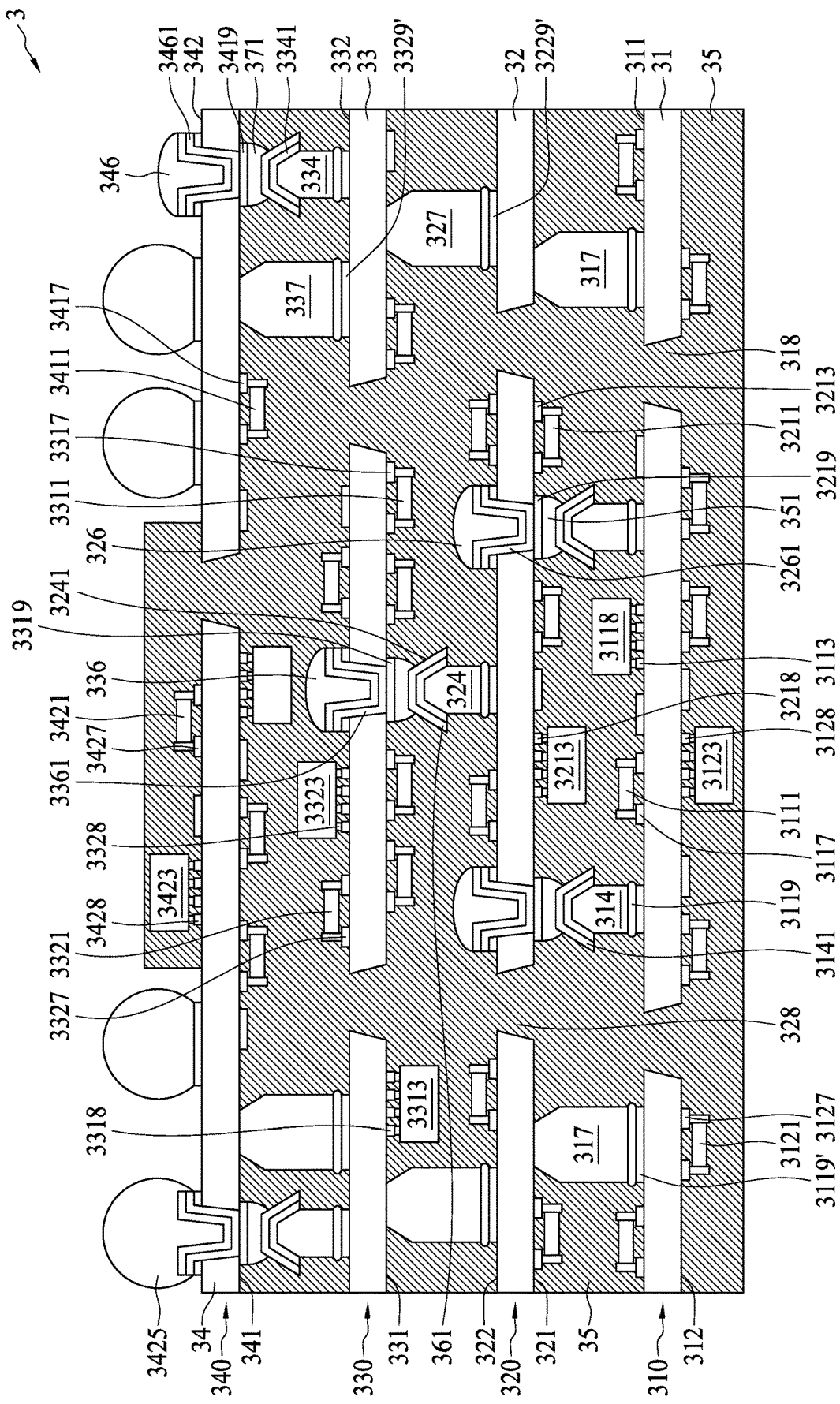
FIG. 4 is a cross-sectional view of a semiconductor device package in accordance with an embodiment of the instant disclosure.

FIG. 4 is a cross-sectional view of a semiconductor device package 3 in accordance with some embodiments of the present disclosure. As shown in FIG. 4, the semiconductor device 3 includes four double side modules (DSM) 310, 320, 330 and 340. The double side module 310 includes a substrate 31 with a surface 311 (e.g., an upper surface) and a surface 312 (e.g., a lower surface) opposite to the surface 311. Electronic components 2121 and 3123 are disposed on the surface 312 of the substrate 21. In some embodiments, the electronic components 3121 are mounted to the surface 312 of the substrate 31 by electrical connections 3127, and the electronic component 3123 is mounted to the surface 312 of the substrate 21 by electrical connections 3128. Further, electronic components 3111 and 3113 are disposed on the surface 311 of the substrate 21. In some embodiments, the electronic components 3111 are mounted to the surface 311 of the substrate 31 by electrical connections 3117, and the electronic component 3113 is mounted to the surface 311 of the substrate 31 by electrical connections 3118. In addition, connectors 314 and spacers 317 are disposed on the surface 311 of the substrate 31. Generally, a height of the spacer 317 is larger than a height of the connector 314. In some embodiments, the connectors 314 and the spacers 317 are mounted to the surface 311 of the substrate 31 by pads 3119, 3119'. Moreover, in some embodiments, a distance between two spacers 317 is larger than a half of width of the substrate 31. In some embodiments, the spacer 317 is made of metal material. In some embodiments, the spacer 317 is made of non-metal material. Moreover, the connector 314 may have a tapered upper end, and the spacer 317 may have a tapered upper end. The height ratio of the connector 314 to the spacer 317 ranges from 0.4 to 1.0. Further, the connector 314 includes a seed layer 3141 at its top end. The substrate 31 includes through openings 318 such that the space above the surface 311 of the substrate 31 and the space underneath the surface 312 of the substrate 31 communicate with each other by the through openings 318.

The double side module 320 includes a substrate 32 with a surface 321 (e.g., a lower surface) facing the surface 311 of the substrate 31 and a surface 322 opposite to the surface 321. Electronic components 3211 and 3213 are disposed on the surface 321 of the substrate 32. In some embodiments, the electronic components 3211 are mounted to the surface 321 of the substrate 32 by electrical connections 3217, and the electronic component 3213 is mounted to the surface 321 of the substrate 32 by electrical connections 3218. Pads 3219 are disposed on the surface 321 of the substrate 32. Further, the spacers 317 contact with the surface 321 of the substrate 32. In other words, the spacers 317 support the substrate 32. Thus, the distance between the surface 311 of the substrate 31 and the surface 321 of the substrate 32 is defined by the height of the spacer 317. Therefore, the ratio of the height of the connector 314 to the distance between the surface 311 of the substrate 31 and the surface 321 of the substrate 32 ranges from 0.4 to 1.0. In some embodiments, the spacer 317 is made of metal material, and thus the substrates 31 and 32 are electrically connected to each other by the spacer 317. Further, electronic components 3221 are disposed on the surface 322 of the substrate 32. In some embodiments, the electronic components 3221 are mounted to the surface 322 of the substrate 32 by electrical connections 3227. In addition, connectors 324 and spacers 327 are disposed on the surface 322 of the substrate 32. Generally, a height of the spacer 327 is larger than a height of the connector 324. In some embodiments, the connectors 324 and the spacers 327 are mounted to the surface 322 of the substrate 32 by pads 3229, 3229'. Moreover, a distance between two spacers 327 is larger than a half of width of the substrate 32. In some embodiments, the spacer 327 is made of metal material. In some embodiments, the spacer 327 is made of non-metal material. Moreover, the connector 324 may have a tapered upper end, and the spacer 327 may have a tapered upper end. The height ratio of the connector 324 to the spacer 327 ranges from 0.4 to 1.0. Further, the connector 324 includes a seed layer 3241 at its top end. The substrate 32 includes through openings 328 such that the space above the surface 322 of the substrate 32 and the space underneath the surface 321 of the substrate 32 communicate with each other by the through openings 328.

In addition, the double side module 320 includes conductors 326 passing through or penetrating the substrate 32 and contacting with the pads 3219. Moreover, a solder ball 351 is arranged between the connector 314 and the pad 3219, and thus the conductor 326 and the connector 314 are electrically connected to each other by the solder ball 351. The modules 310 and 320 can be electrically connected to each other by the conductor 326 and the connector 314. The conductor 326 may be tapered from its upper end to its lower end. In some embodiments, the conductor 326 has a seed layer 3261. The seed layer 3261 is substantially disposed on the outer surface of the conductor 326. Thus, the seed layer 3261 is substantially arranged between the conductor 326 and the substrate 32 and substantially arranged between the conductor 326 and the pads 3219.

The double side module 330 includes a substrate 33 with a surface 331 (e.g., a lower surface) facing the surface 321 of the substrate 32 and a surface 332 opposite to the surface 331. Electronic components 3311 and 3313 are disposed on the surface 331 of the substrate 33. In some embodiments, the electronic components 3311 are mounted to the surface 331 of the substrate 33 by electrical connections 3317, and the electronic component 3313 is mounted to the surface 331 of the substrate 33 by electrical connections 3318. Pads 3319 are disposed on the surface 331 of the substrate 33. Further, the spacers 327 contact with the surface 331 of the substrate 33. In other words, the spacers 327 support the substrate 33. Thus, the distance between the surface 322 of the substrate 32 and the surface 331 of the substrate 33 is defined by the height of the spacer 327. Therefore, the ratio of the height of the connector 324 to the distance between the surface 322 of the substrate 32 and the surface 331 of the substrate 33 ranges from 0.4 to 1.0. In some embodiments, the spacer 327 is made of metal material, and thus the substrates 32 and 33 are electrically connected to each other by the spacer 327. Further, electronic components 3321, 3323 are disposed on the surface 332 of the substrate 32. In some embodiments, the electronic components 3321 are mounted to the surface 332 of the substrate 32 by electrical connections 3327. In some embodiments, the electronic components 3323 are mounted to the surface 332 of the substrate 33 by electrical connections 3328. In addition, connectors 334 and spacers 337 are disposed on the surface 332 of the substrate 33. Generally, a height of the spacer 337 is larger than a height of the connector 334. In some embodiments, the connectors 334 and the spacers 337 are mounted to the surface 332 of the substrate 33 by pads 3329, 3329'. Moreover, a distance between two spacers 337 is larger than a half of width of the substrate 33. In some embodiments, the spacer 337 is made of metal material. In some embodiments, the spacer 337 is made of non-metal material. Moreover, the connector 334 may have a tapered upper end, and the spacer 337 may have a tapered upper end. The height ratio of the connector 334 to the spacer 337 ranges from 0.4 to 1.0. Further, the connector 334 includes a seed layer 3341 at its top end. The substrate 33 includes through openings 338 such that the space above the surface 332 of the substrate 33 and the space underneath the surface 331 of the substrate 33 communicate with each other by the through openings 338.

In addition, the double side module 330 includes conductors 336 passing through or penetrating the substrate 33 and contacting with the pads 3319. Moreover, a solder ball 361 is arranged between the connector 324 and the pad 3319, and thus the conductor 336 and the connector 324 are electrically connected to each other by the solder ball 361. The modules 320 and 330 can be electrically connected to each other by the conductor 336 and the connector 324. The conductor 336 may be tapered from its upper end to its lower end. In some embodiments, the conductor 336 has a seed layer 3361. The seed layer 3361 is substantially disposed on the outer surface of the conductor 336. Thus, the seed layer 3361 is substantially arranged between the conductor 336 and the substrate 33 and substantially arranged between the conductor 336 and the pads 3319.

The double side module 340 includes a substrate 34 with a surface 341 (e.g., a lower surface) facing the surface 331 of the substrate 33 and a surface 342 opposite to the surface 341. Electronic components 3411 and 3413 are disposed on the surface 341 of the substrate 34. In some embodiments, the electronic components 3411 are mounted to the surface 341 of the substrate 34 by electrical connections 3417, and the electronic component 3413 is mounted to the surface 341 of the substrate 34 by electrical connections 3418. Pads 3419 are disposed on the surface 341 of the substrate 34. Further, the spacers 337 contact with the surface 341 of the substrate 34. In other words, the spacers 337 support the substrate 34. Thus, the distance between the surface 332 of the substrate 33 and the surface 341 of the substrate 34 is defined by the height of the spacer 337. Therefore, the ratio of the height of the connector 334 to the distance between the surface 332 of the substrate 33 and the surface 341 of the substrate 34 ranges from 0.4 to 1.0. In some embodiments, the spacer 337 is made of metal material, and thus the substrates 33 and 34 are electrically connected to each other by the spacer 337. Further, electronic components 3421, 3423 are disposed on the surface 342 of the substrate 34. In some embodiments, the electronic components 3421 are mounted to the surface 342 of the substrate 34 by electrical connections 3427. In some embodiments, the electronic components 3423 are mounted to the surface 342 of the substrate 34 by electrical connections 3428. Further, electrical connections 3425, such as solder balls, are disposed on the surface 342 of the substrate 34 as well. The substrate 34 includes through openings 348 such that the space above the surface 342 of the substrate 34 and the space underneath the surface 341 of the substrate 34 communicate with each other by the through openings 348.

In addition, the double side module 340 includes conductors 346 passing through or penetrating the substrate 34 and contacting with the pads 3419. Moreover, a solder ball 371 is arranged between the connector 334 and the pad 3419, and thus the conductor 346 and the connector 334 are electrically connected to each other by the solder ball 371. The modules 330 and 340 can be electrically connected to each other by the conductor 346 and the connector 334. The conductor 346 may be tapered from its upper end to its lower end. In some embodiments, the conductor 346 has a seed layer 3461. The seed layer 3461 is substantially disposed on the outer surface of the conductor 346. Thus, the seed layer 3461 is substantially arranged between the conductor 346 and the substrate 34 and substantially arranged between the conductor 346 and the pads 3419.

Moreover, the semiconductor device 3 includes an encapsulant 35. The encapsulant 35 may include molding compounds such epoxy resin, and fillers such as silicon oxide fillers may be filled in the molding compound. In addition, the encapsulant 35 may include a molding underfill (MUF) or a capillary underfill (CUF). The encapsulant 35 is an unique once molding structure and encapsulates the electronic components 3421, 3423, a portion of the surface 342 of the substrate 34, the electronic components 3411, 3413, the pads 3419, the surface 341 of the substrate 34, the solder balls 371, the spacers 337, the connections 334, the conductor 336, the electronic elements 3321, 3323, the surface 332 of the substrate 33, the electronic components 3311, 3313, the pads 3319, the surface 331 of the substrate 33, the solder balls 361, the spacers 327, the connections 324, the conductors 326, the electronic components 3221, 3223, the surface 322 of the substrate 32, the electronic components 3211, 3213, the pads 3219, the surface 321 of the substrate 32, the solder balls 351, the spacers 317, the connections 314, the electronic components 3111, 3113, the surface 311 of the substrate 31, the electronic components 3121, 3123 and the surface 312 of the substrate 31. Since the substrate 31 has the openings 318, the substrate 32 has the openings 328, the substrate 33 has the openings 338 and the substrate 34 has the opening 348, the encapsulant 35 can be formed by a once molding process.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. A semiconductor device package, comprising:
a first substrate having a first surface;
a first connector disposed on the first surface of the first substrate;

a second substrate having a through opening and a first surface facing the first surface of the first substrate; and a first conductor passing through the through opening of the second substrate and electrically connecting to the first connector;

wherein the first conductor has an end adjacent to the first connecter, and wherein a cross-sectional width of the end of the first conductor is smaller than a cross-sectional width of the through opening of the second substrate.

2. The semiconductor device package of claim 1, wherein the second substrate has a second surface opposite the first surface of the second substrate, and wherein the first conductor comprises a first width adjacent to the first surface of the second substrate and a second width adjacent to the second surface of the second substrate, and wherein the second width is greater than the first width.

3. The semiconductor device package of claim 2, wherein the first conductor is tapered from the second surface of the second substrate to the first surface of the second substrate in cross-section.

4. The semiconductor device package of claim 1, further comprising:

a second connector disposed on a second surface of the second substrate which is opposite the first surface of the second substrate;

a third substrate having a first surface facing the second surface of the second substrate; and a second conductor passing through the third substrate and electrically connecting to the second connector.

5. The semiconductor device package of claim 4, wherein a height of the first conductor is different from a height of the second conductor.

6. The semiconductor device package of claim 4, wherein a melting point of the first conductor is higher than a melting point of the second conductor.

7. The semiconductor device package of claim 4, wherein the first conductor and the second connector are composed of the same material.

8. The semiconductor device package of claim 1, further comprising a conductive pattern on the second surface of the second substrate and in connection with the first conductor.

9. The semiconductor device package of claim 1, wherein the second substrate has a second surface opposite to the first surface of the second substrate, a first pad on the second surface of the second substrate, and wherein the first pad contacts the first conductor, and wherein the through opening passes through the first pad and is substantially surrounded by the first pad.

10. The semiconductor device package of claim 1, further comprising a first spacer between the first substrate and the second substrate and contacting with the first substrate and the second substrate, wherein a height of the first spacer is greater than a height of the first connector, and wherein the first spacer is located between the first connector and a side surface of the first substrate.

11. The semiconductor device package of claim 9, further comprising a first electronic component mounted on the first surface of the first substrate and a second electronic component mounted on the first surface of the second substrate.

12. The semiconductor device package of claim 9, further comprising a second pad on the first surface of the second substrate and substantially underneath the first pad, wherein the second pad contacts the first conductor, and wherein the through opening passes through the second pad and is substantially surrounded by the second pad.

13. The semiconductor device package of claim 11, wherein the first pad is covered by the first conductor.

14. The semiconductor device package of claim 11, wherein the second substrate has a second surface opposite to the first surface of the second substrate, further comprising an encapsulant on the second surface of the second substrate and covers a portion of the second surface of the second substrate.

15. A semiconductor device package, comprising:

a first substrate;

a first connector disposed on the first substrate;

a second substrate arranged above the first substrate, wherein the second substrate has a first surface facing the first substrate and a pad disposed on the first surface of the second substrate; and a first conductor penetrating the second substrate and electrically contacting with the first connector, wherein the first conductor passes through the pad and protrudes from the pad.

16. The semiconductor device package of claim 15, further comprising a first spacer between the first substrate and the second substrate and configured to support the second substrate, and wherein a height of the first spacer is smaller than a distance between the first substrate and the second substrate.

17. The semiconductor device package of claim 16, further comprising an encapsulant between the first substrate and the second substrate, wherein the encapsulant is configured to encapsulate a portion the first conductor and the first spacer.

18. The semiconductor device package of claim 17, wherein the first connector is disposed on the first substrate through a solder material.

19. The semiconductor device package of claim 17, further comprising a second spacer between the first substrate and the second substrate and contacting with the first substrate and the second substrate, and wherein a distance between the first spacer and the second spacer is greater than half of a cross-sectional width of the first substrate.

20. The semiconductor device package of claim 15, further comprising:

a third substrate arranged above the second substrate;

a second connector disposed on the second substrate; and a second conductor penetrating the second substrate and electrically contacting with the second connector.

* * * * *